(12) United States Patent
Chou

(10) Patent No.: US 12,176,267 B2
(45) Date of Patent: Dec. 24, 2024

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/382,203

(22) Filed: Oct. 20, 2023

(65) Prior Publication Data

US 2024/0047307 A1 Feb. 8, 2024

Related U.S. Application Data

(60) Division of application No. 18/208,510, filed on Jun. 12, 2023, which is a continuation-in-part of application No. 17/411,678, filed on Aug. 25, 2021, now Pat. No. 11,721,610, which is a division of application No. 16/440,112, filed on Jun. 13, 2019, now Pat. No. 11,183,443.

(51) Int. Cl.
*H01L 23/48* (2006.01)
*H01L 21/768* (2006.01)
*H01L 23/522* (2006.01)
*H01L 23/532* (2006.01)

(52) U.S. Cl.
CPC ...... *H01L 23/481* (2013.01); *H01L 21/76838* (2013.01); *H01L 21/76898* (2013.01); *H01L 23/5226* (2013.01); *H01L 23/53238* (2013.01)

(58) Field of Classification Search
CPC ............... H01L 23/481; H01L 23/5226; H01L 23/53238
See application file for complete search history.

(56) References Cited

U.S. PATENT DOCUMENTS

2016/0358818 A1* 12/2016 Kuo ................. H01L 21/76898
2022/0238487 A1* 7/2022 Shih ........................ H01L 25/50

* cited by examiner

*Primary Examiner* — Walter H Swanson
(74) *Attorney, Agent, or Firm* — Xuan Zhang

(57) ABSTRACT

The present disclosure provides a semiconductor device. The semiconductor device includes a die stack, an intervening bonding layer, and a carrier structure. The intervening bonding layer is positioned on the die stack. The carrier structure is disposed on the intervening bonding layer opposite to the die stack. The carrier structure includes a heat dissipation unit configured to transfer heat generated from the die stack. The heat dissipation unit includes composite vias and conductive plates. Each of the composite vias includes a first through semiconductor via and a second through semiconductor via. The conductive plates are couple to the composite vias.

14 Claims, 25 Drawing Sheets

SEMICONDUCTOR DEVICE AND METHOD FOR MANUFACTURING THE SAME

CROSS-REFERENCE TO RELATED APPLICATION

This application is a divisional application of U.S. Non-Provisional application Ser. No. 18/208,510 filed Jun. 12, 2023, which is a continuation-in-part application of U.S. Non-Provisional application Ser. No. 17/411,678 filed Aug. 25, 2021, which is a divisional application of U.S. Non-Provisional application Ser. No. 16/440,112 filed Jun. 13, 2019. Those are incorporated herein by reference in their entireties.

TECHNICAL FIELD

The present disclosure relates to a method for manufacturing a semiconductor structure, and more particularly, to a method for manufacturing a semiconductor structure having through semiconductor vias.

DISCUSSION OF THE BACKGROUND

Semiconductor devices are essential for many modern applications. With the advancement of electronic technology, semiconductor devices are steadily becoming smaller and smaller while providing greater functionality and including greater amounts of integrated circuits. To leverage the miniaturized scale of semiconductor devices, a conventional semiconductor structure including through semiconductor vias is provided to reduce electrical resistance, so that the semiconductor structure can have increased conduction efficiency and reduced size.

The conventional semiconductor structure includes an underlying semiconductor layer, a plurality of semiconductor dies, a plurality of through semiconductor vias, and an electrical connecting pad. The semiconductor dies are disposed on the underlying semiconductor layer. The plurality of through semiconductor vias extend through the underlying semiconductor layer and the semiconductor dies, and the through semiconductor vias are used to electrically connect the semiconductor dies to one another and to another semiconductor device above the semiconductor dies or under the underlying semiconductor layer. The electrical connecting pad is disposed on the semiconductor dies to interconnect some of the adjacent through semiconductor vias to each other.

However, as semiconductor devices continue to become smaller, it becomes increasingly difficult to dispose the electrical connecting pad in the correct position. If the electrical connecting pad is incorrectly positioned, the conductive performance of the semiconductor devices may be adversely affected.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a die stack, an intervening bonding layer, and a carrier structure. The intervening bonding layer is positioned on the die stack. The carrier structure is disposed on the intervening bonding layer opposite to the die stack. The carrier structure includes a heat dissipation unit configured to transfer heat generated from the die stack. The heat dissipation unit includes composite vias and conductive plates. Each of the composite vias includes a first through semiconductor via and a second through semiconductor via. The conductive plates are couple to the composite vias.

In some embodiments, the carrier structure further includes a carrier substrate and a bonding layer. The bonding layer is coupled between the intervening bonding layer and the carrier substrate. The heat dissipation unit is disposed in the carrier substrate and the bonding layer.

In some embodiments, the heat dissipation unit further includes a first protection layer surrounding the first through semiconductor via; and a second protection layer surrounding the second through semiconductor via.

In some embodiments, the first protection layer includes tantalum material and tantalum nitride material, and the second protection layer includes tantalum material and tantalum nitride material.

In some embodiments, the first through semiconductor via and the second through semiconductor via are extending continuously through the carrier substrate.

In some embodiments, a bottom portion of the first through semiconductor via and a bottom portion of the second through semiconductor via are protruding from a first conductive plate of the plurality of the conductive plates.

In some embodiments, the heat dissipation unit further includes a bottom conductive connecting portion covering the bottom portion of the first through semiconductor via and a bottom portion of the second through semiconductor via.

In some embodiments, the first through semiconductor via is electrically coupled to the second through semiconductor via through the bottom conductive connecting portion.

In some embodiments, the bottom conductive connecting portion includes copper.

In some embodiments, the bottom conductive connecting portion is free of being contact with the first protection layer and the second protection layer.

In some embodiments, width of the first through semiconductor via is greater than a width of the second through semiconductor via.

In some embodiments, a top portion of the first through semiconductor via and a top portion of the second through semiconductor via are protruding from the carrier substrate.

In some embodiments, the heat dissipation unit further includes an upper conductive connecting portion covering the top portion of the first through semiconductor via and the top portion of the second through semiconductor via.

In some embodiments, the upper conductive connecting portion includes copper-germanium alloy.

In some embodiments, the first through semiconductor via is electrically coupled to the second through semiconductor via through the upper conductive connecting portion.

Another aspect of the present disclosure provides a semiconductor device. The semiconductor device includes a first die structure, a second die structure, an intervening bonding layer, a carrier structure, and a first dummy through semiconductor via. The first die structure is stacked over the second die structure. The intervening bonding layer is positioned on the first die structure opposite to the second die structure. The carrier structure is disposed on the intervening bonding layer opposite to the first die structure. The first dummy through semiconductor via is configured to transfer heat accumulated in the first die structure and the second die structure. The first dummy through semiconductor via includes a first via, a second via, and a first bottom conductive connecting portion. The first bottom conductive connecting portion is electrically coupled to the first via and the second via.

In some embodiments, the first via and the second via are extending through the first die structure and the second die structure.

In some embodiments, the first via and the second via are in contact with the intervening bonding layer.

In some embodiments, the first via and the second via are in contact with the carrier structure.

In some embodiments, a width of the first via is greater than a width of the second via.

In some embodiments, a length of the first via is equal to a length of the second via.

In some embodiments, the semiconductor device further includes a second dummy through semiconductor via configured to transfer heat accumulated in the first die structure and the second die structure. The second dummy through semiconductor includes a third via, a fourth via, and a second bottom conductive connecting portion electrically coupled to the third via and the fourth via.

In some embodiments, a length of the first dummy through semiconductor via is greater than a length of the second dummy through semiconductor via.

In some embodiments, the second dummy through semiconductor via is disposed in the first die structure and the second die structure, and is not exposed by the second die structure.

In some embodiments, the semiconductor device further includes a third dummy through semiconductor via configured to transfer heat accumulated in the first die structure and the second die structure. The third dummy through semiconductor via includes a fifth via, a sixth via, and a third bottom conductive connecting portion electrically coupled to the fifth via and the sixth via.

In some embodiments, a length of the second dummy through semiconductor via is greater than a length of the third dummy through semiconductor via.

In some embodiments, the third dummy through semiconductor via is disposed in the first die structure, and is not in contact with the second die structure.

In some embodiments, the carrier structure includes a bonding layer, a carrier substrate, and a heat dissipation unit. The bonding layer is disposed over the intervening bonding layer. The carrier substrate is disposed over the bonding layer. The heat dissipation unit is disposed in the bonding layer and the carrier substrate.

In some embodiments, the heat dissipation unit includes first composite vias, second composite vias, a first conductive plate, and a second conductive plate. The first conductive plate is coupled to the first composite vias. The second conductive plate is coupled to the second composite vias.

Another aspect of the present disclosure provides a method for manufacturing a semiconductor device. The method includes: providing a carrier structure; providing a first die structure having a through semiconductor via; forming an intervening bonding layer on the first die structure; bonding the first die structure onto the carrier structure through the intervening bonding layer; and bonding a second die structure onto the first die structure, wherein the second die structure and the first die structure are electrically coupled by the through semiconductor via. The operation of providing the carrier structure includes: providing a carrier substrate; forming a bonding layer on the carrier substrate; and forming a heat dissipation unit in the carrier substrate and the bonding layer, wherein the carrier substrate, the bonding layer, and the heat dissipation unit together configure the carrier structure. The operation of forming the heat dissipation unit in the carrier substrate and the bonding layer includes forming a conductive plate; and forming a composite via on the conductive plate, wherein the composite via comprises a first through via, a second through via, and a bottom conductive connecting portion. A bottom portion of the first through via and a bottom portion of the second through via are covered by the bottom conductive connecting portion.

In some embodiments, the first through via is electrically coupled to the second through via through the bottom conductive connecting portion.

In some embodiments, a width of the first through via is greater than a width of the second through via.

In some embodiments, the operation of forming the heat dissipation unit in the carrier substrate and the bonding layer further includes: forming a first protection layer surrounding the first through via; and forming a second protection layer surrounding the second through via. The first protection layer and the second protection layer include tantalum material and tantalum nitride material.

In some embodiments, the bottom conductive connecting portion is not in contact with the first protection layer and the second protection layer.

In some embodiments, the composite via further comprises an upper conductive connecting portion, wherein a top portion of the first through via and a top portion of the second through via are covered by the upper conductive connecting portion.

With the design of the semiconductor structure, the conductive connecting portion can be disposed in the correct position and the conductive performance can be thereby improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
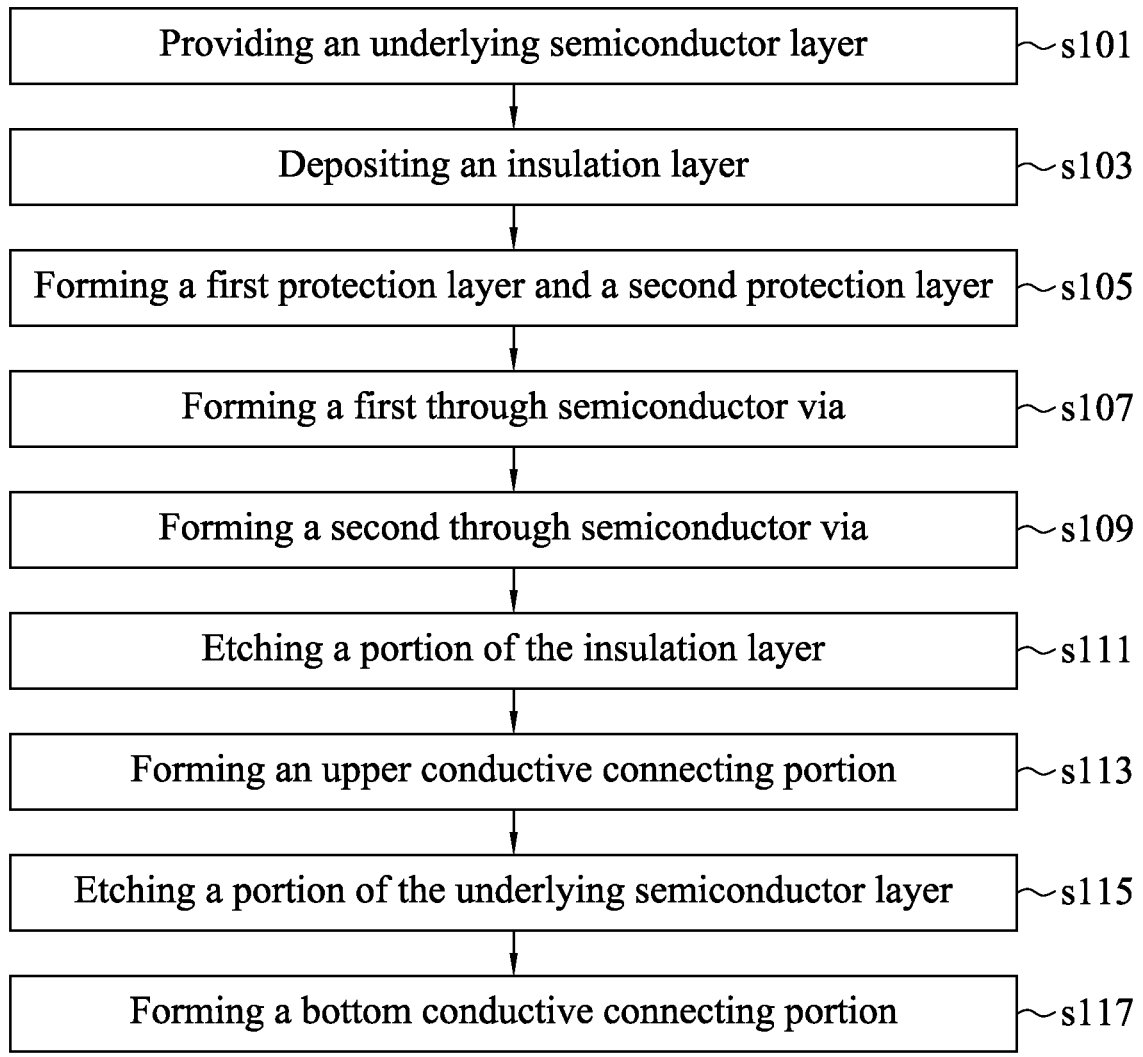
FIG. 1 is a flow diagram illustrating a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "bottom," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method for manufacturing a semiconductor structure in accordance with some embodiments of the present disclosure. FIGS. 2 to 11 are schematic views illustrating stages of manufacturing a semiconductor structure 300 by the method of FIG. 1 in accordance with some embodiments of the present disclosure. In some embodiments, the method of FIG. 1 for manufacturing the semiconductor structure 300 includes a number of operations (s101, s103, s105, s107, s109, s111, s113, s115, and s117), and the description and illustration below are not deemed as a limitation to the sequence of the operations.

Figure 2:
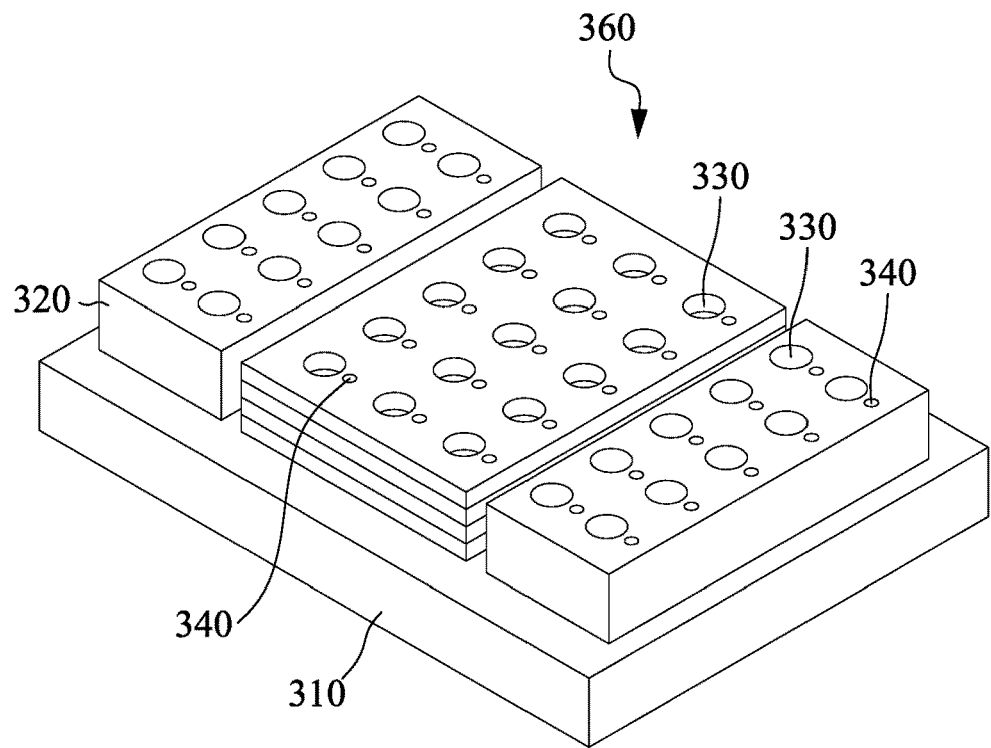
FIGS. 2 to 11 are schematic views illustrating stages of manufacturing a semiconductor structure by the method of FIG. 1 in accordance with some embodiments of the present disclosure.
Figure 3:
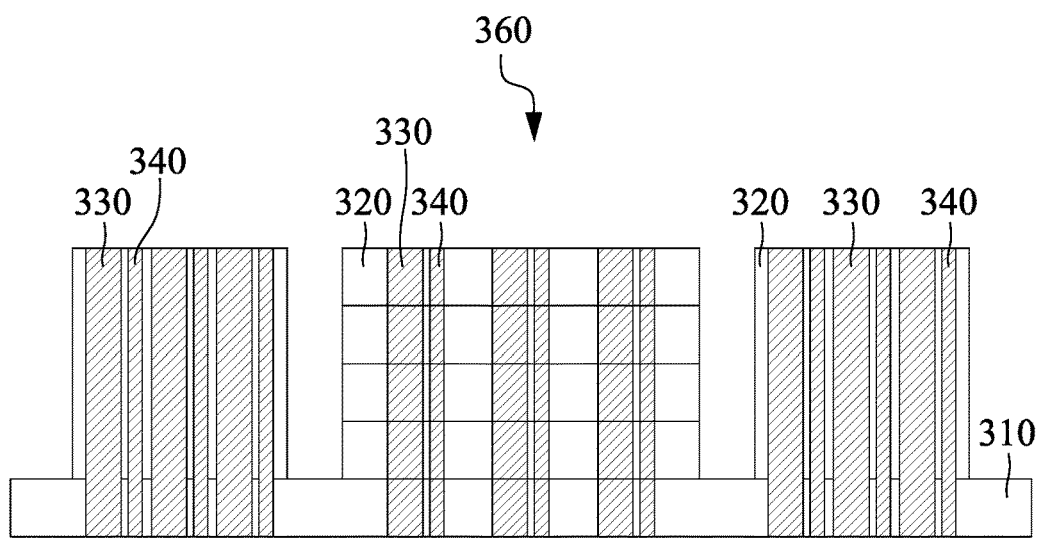
Figure 4:
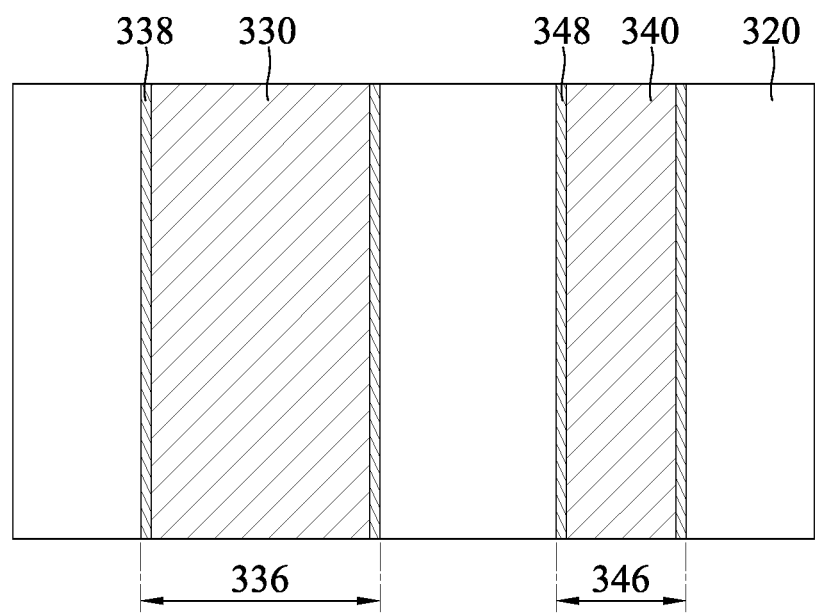

In operation s101, as shown in FIGS. 2 to 4, an underlying semiconductor layer 310 is provided. In some embodiments, the underlying semiconductor layer 310 includes a semiconductor substrate, such as a silicon substrate, an epitaxial substrate, a silicon carbide substrate, a silicon-on-insulator (SOI) substrate or the like. In some embodiments, a stack of semiconductor dies 360 is disposed over the underlying semiconductor layer 310.

In operation s103, as shown in FIGS. 2 to 4, an insulation layer 320 is deposited over the underlying semiconductor layer 310. In some embodiments, the insulation layer 320 may be formed of oxide material or nitride material, such as silicon oxide, silicon nitride, or the like. In some embodiments, the insulation layer 320 is deposited over the stack of semiconductor dies 360.

In some embodiments, the insulation layer 320 is deposited using a plasma-enhanced chemical vapor deposition (PECVD) process, a chemical vapor deposition (CVD) process, a physical vapor deposition (PVD) process or other suitable deposition process.

In some embodiments, the underlying semiconductor layer 310 is a printed circuit board (PCB). As illustrated in FIG. 2, the insulation 320 has three portions (a middle portion disposed between a left portion and a right portion). The insulation layer 320, a first through semiconductor via 330, and a second through semiconductor via 340 in the left portion and the right portion are implemented to be interposers. The insulation layer 320 in the middle portion includes memory dies. The first through semiconductor via 330 and the second through semiconductor via 340 are disposed together in pairs, and each pair of the first through semiconductor via 330 and the second through semiconductor via 340 is also referred to as a composite via or a composite heat-dissipation via. The composite heat-dissipation via is configured to transfer heat to the underlying semiconductor layer 310. The heat may be generated by the memory die, other logic die coupled to the insulation layer 320, and/or the stack of semiconductor dies 360.

In operation s105, as shown in FIG. 4, a first protection layer 338 and a second protection layer 348 are formed. In some embodiments, the first protection layer 338 includes tantalum material and tantalum nitride material. The second protection layer 348 includes tantalum material and tantalum nitride material. The first protection layer 338 and the second protection layer 348 are used to prevent diffusion of metal material formed in the subsequent steps.

In operation s107, as shown in FIG. 4, the first through semiconductor via 330 is formed. The first through semiconductor via 330 extends continuously through the insulation layer 320. The first through semiconductor via 330 is surrounded by the first protection layer 338. In some embodiments, the first through semiconductor via 330 is formed through the underlying semiconductor layer 310 (FIG. 3).

In operation s109, as shown in FIG. 4, the second through semiconductor via 340 is formed. The second through semiconductor via 340 extends continuously through the insulation layer 320. In some embodiments, the second through semiconductor via 340 is formed through the underlying semiconductor layer 310 (FIG. 3). In some embodiments, the second through semiconductor via 340 is surrounded by the second protection layer 348.

As shown in FIG. 4, the first through semiconductor via 330 has a first via width 336 and the second through semiconductor via 340 has a second via width 346, and the first via width 336 is greater than the second via width 346.

Figure 5:
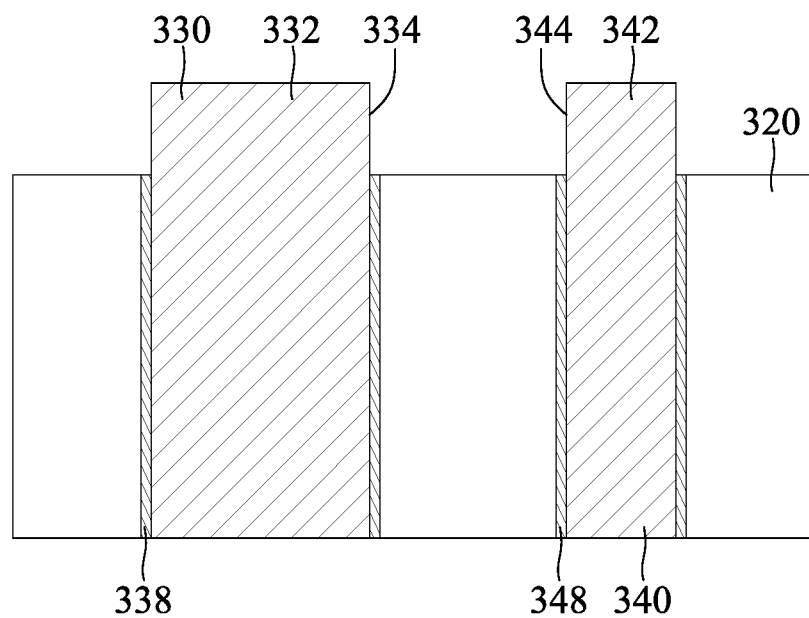

In operation s111, as shown in FIG. 5, a portion of the insulation layer 320 is etched to expose a first upper end 332 of the first through semiconductor via 330 above the insulation layer 320 and a second upper end 342 of the second through semiconductor via 340 above the insulation layer 320. In some embodiments, the portion of the insulation layer 320 is etched using a wet etching process and a dry etching process.

Figure 6:
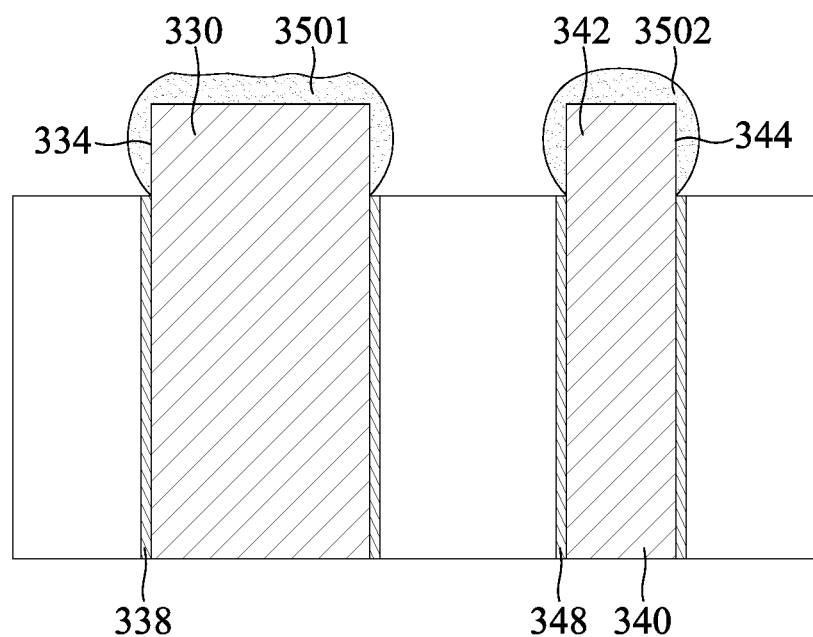
Figure 7:
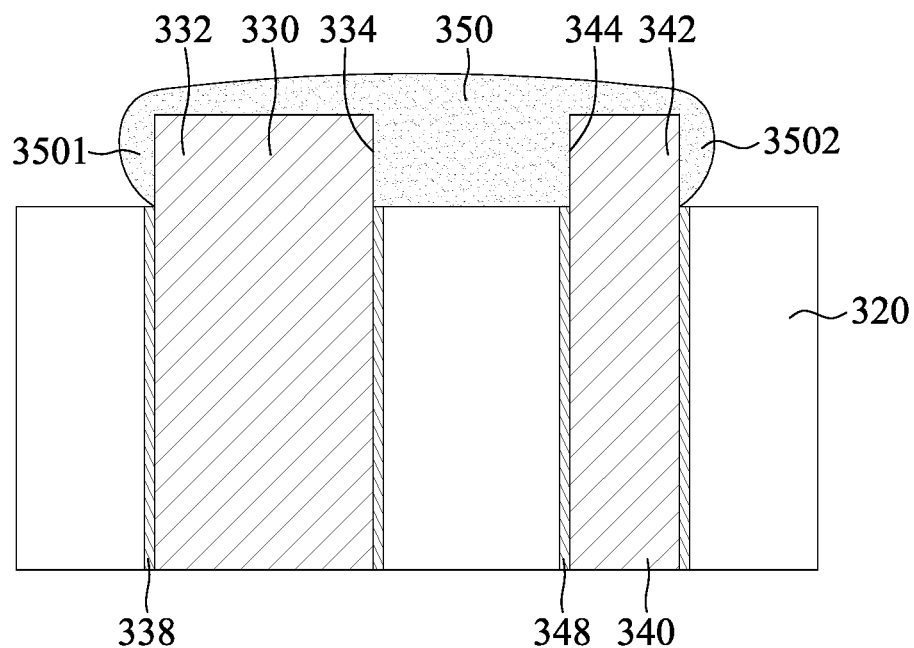

In operation s113, as shown in FIGS. 6 to 7, an upper conductive connecting portion 350 is formed and laterally connected to a first upper lateral surface 334 of the first upper end 332 and a second upper lateral surface 344 of the second upper end 342 by a self-aligned deposition process. More specifically, the upper conductive connecting portion 350 includes a first portion 3501 and a second portion 3502. During the self-aligned deposition process, as shown in FIG. 6, the first portion 3501 and second portion 3502 are gradually deposited around the first upper lateral surface 334 and the second upper lateral surface 344 respectively until the first portion 3501 and second portion 3502 are connected together. Therefore, the upper conductive connecting portion 350 is completely formed as shown in FIG. 7.

As shown in FIG. 7, in some embodiments, the upper conductive connecting portion 350 is formed by a plating process, such as an electroplating process. In some embodiments, the upper conductive connecting portion 350 is formed of metal material. In some embodiments, top surfaces of the first upper end 332 and the second upper end 342 may be covered by a hard mask while performing the self-aligned deposition process.

In some embodiments, both of the first through semiconductor via 330 and the second through semiconductor via 340 include copper material. The upper conductive connecting portion 350 is deposited by exposing the first upper end 332 of the first through semiconductor via 330 and the second upper end 342 of the second through semiconductor via 340 to $GeH_4$ gas or $Ge_2H_6$ gas. In some embodiments, the upper conductive connecting portion 350 is formed of copper-germanium alloy ($Cu_xGe_y$).

Figure 8:
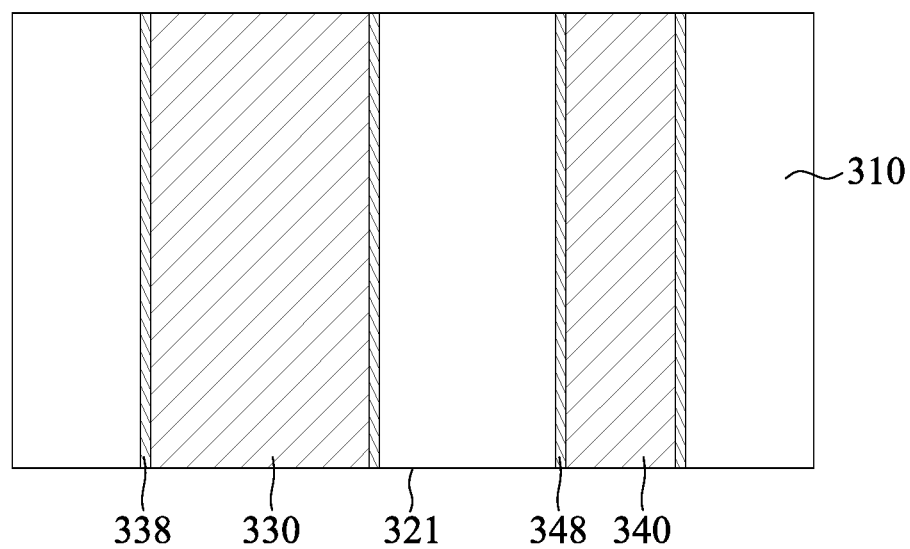
Figure 9:
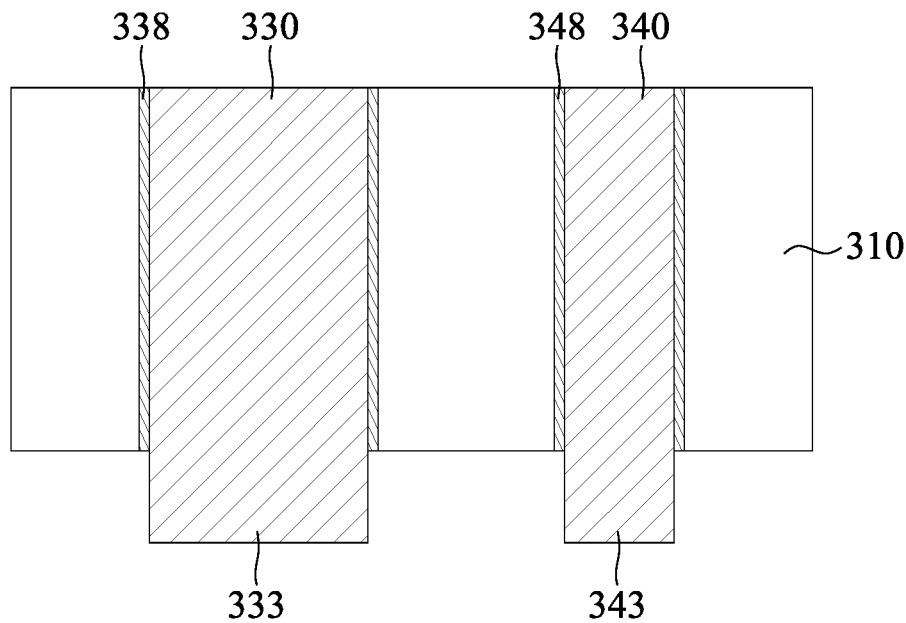

In operation s115, as shown in FIGS. 8 to 9, a portion of the underlying semiconductor layer 310 is etched from a bottom surface 321 of the underlying semiconductor layer 310 to expose a first bottom end 333 of the first through semiconductor via 330 opposite to the first upper end and a second bottom end 343 of the second through semiconductor via 340 opposite to the second upper end. In some embodiments, the portion of the underlying semiconductor layer 310 is etched using a wet etching process or a dry etching process.

Figure 10:
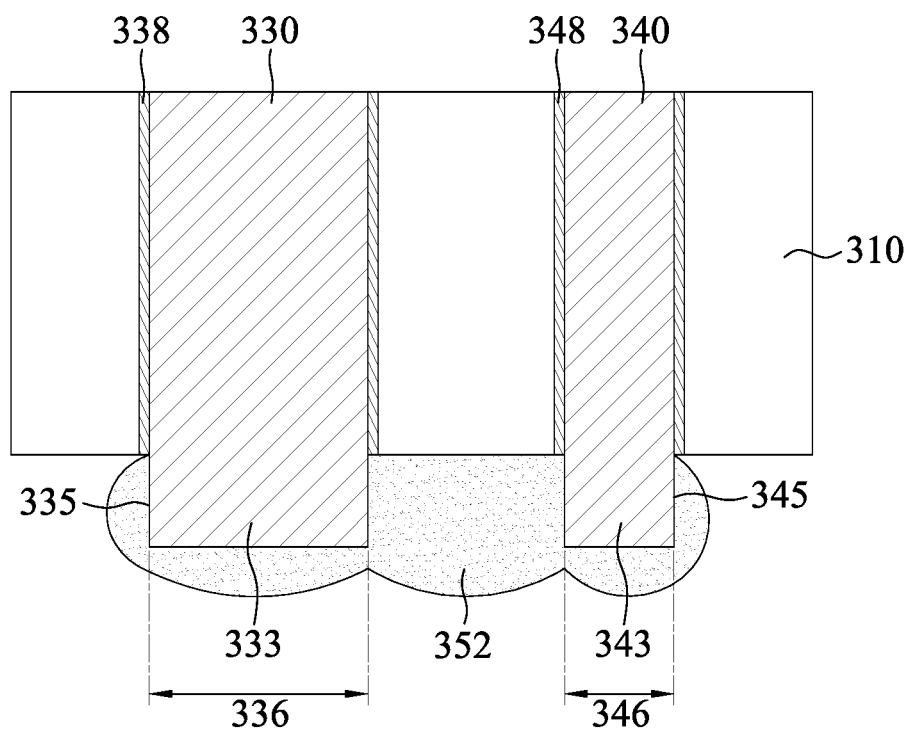
Figure 11:
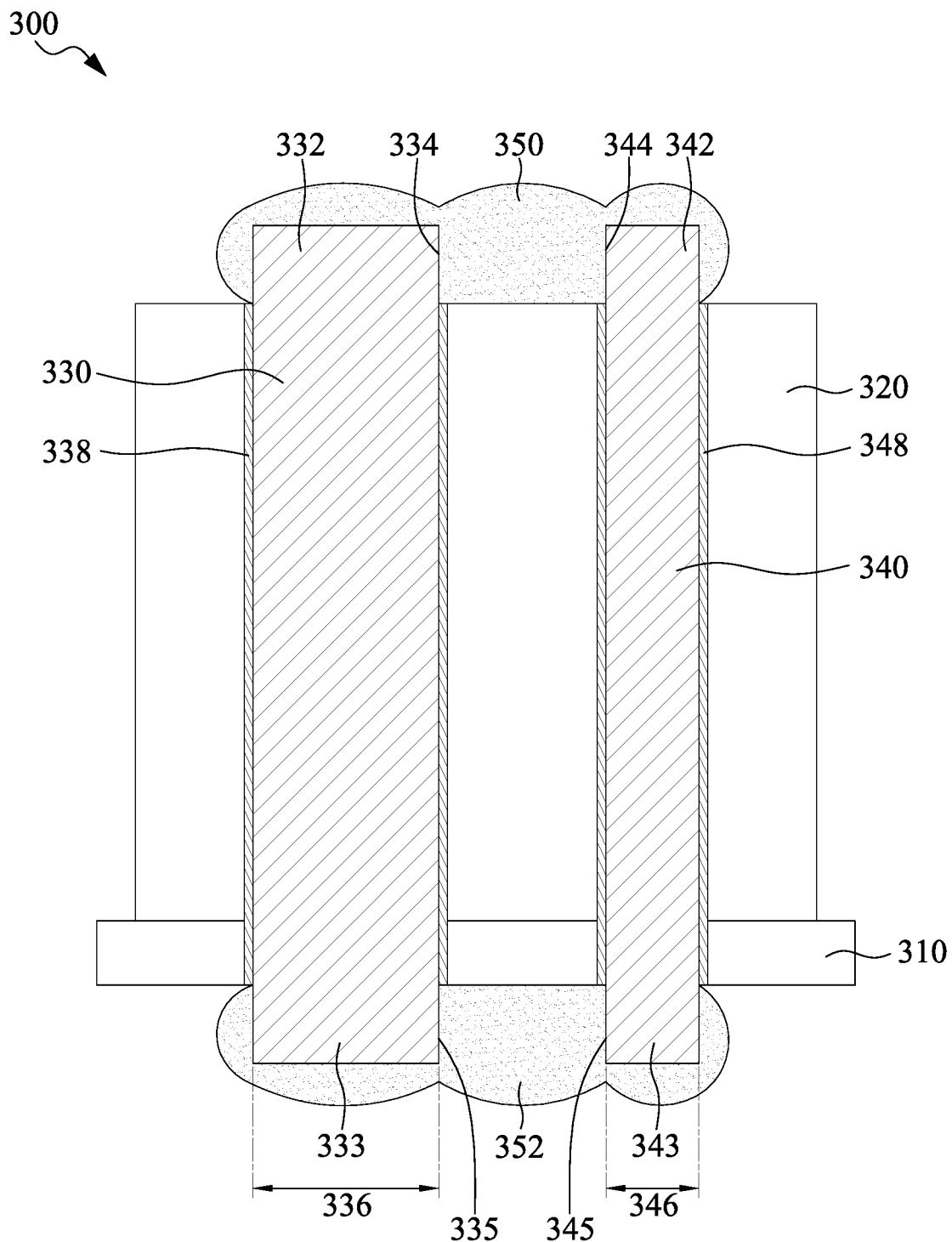

In operation s117, as shown in FIGS. 10 to 11, a bottom conductive connecting portion 352 is formed and laterally connected to a first bottom lateral surface 335 of the first bottom end 333 and a second bottom lateral surface 345 of the second bottom end 343 by a self-aligned deposition process. In some embodiments, the bottom conductive connecting portion 352 is formed by a plating process, such as an electroplating process.

In some embodiments, the bottom conductive connecting portion 352 includes copper material. The bottom conductive connecting portion 352 is deposited by exposing the first bottom end 333 of the first through semiconductor via 330 and the second bottom end 343 of the second through semiconductor via 340 to $GeH_4$ gas or $Ge_2H_6$ gas.

As shown in FIG. 11, a semiconductor structure is disclosed. The semiconductor structure includes the underlying semiconductor layer 310, the insulation layer 320, the first through semiconductor via 330, the second through semiconductor via 340, and the upper conductive connecting portion 350. The insulation layer 320 is disposed over the underlying semiconductor layer 310. The first through semiconductor via 330 extends continuously through the insulation layer 320. The first through semiconductor via 330 includes the first upper end 332 above the insulation layer 320. The second through semiconductor via 340 extends continuously through the insulation layer 320. The second through semiconductor via 340 includes the second upper end 342 above the insulation layer 320. The upper conductive connecting portion 350 is laterally connected to the first upper lateral surface 334 of the first upper end 332 and the second upper lateral surface 344 of the second upper end 342.

As shown in FIG. 11, in some embodiments, the first through semiconductor via 330 has a first via width 336 and the second through semiconductor via 340 has a second via width 346. The first via width 336 is greater than the second via width 346.

In some embodiments, the upper conductive connecting portion 350 is formed by a self-aligned deposition process. The first through semiconductor via 330 includes copper material, and the second through semiconductor via 340 includes copper material. In some embodiments, the upper conductive connecting portion 350 includes copper-germanium alloy ($Cu_xGe_y$).

As shown in FIG. 11, in some embodiments, the first through semiconductor via 330 extends continuously through the underlying semiconductor layer 310, and the second through semiconductor via 340 extends continuously through the underlying semiconductor layer 310. In some embodiments, the stack of semiconductor dies 360 is disposed over the underlying semiconductor layer 310.

In some embodiments, the first protection layer 338 surrounds the first through semiconductor via 330, and the second protection layer 348 surrounds the second through semiconductor via 340. In some embodiments, the first protection layer 338 includes tantalum material and tantalum nitride material, and the second protection layer 348 includes tantalum material and tantalum nitride material.

Figure 12:
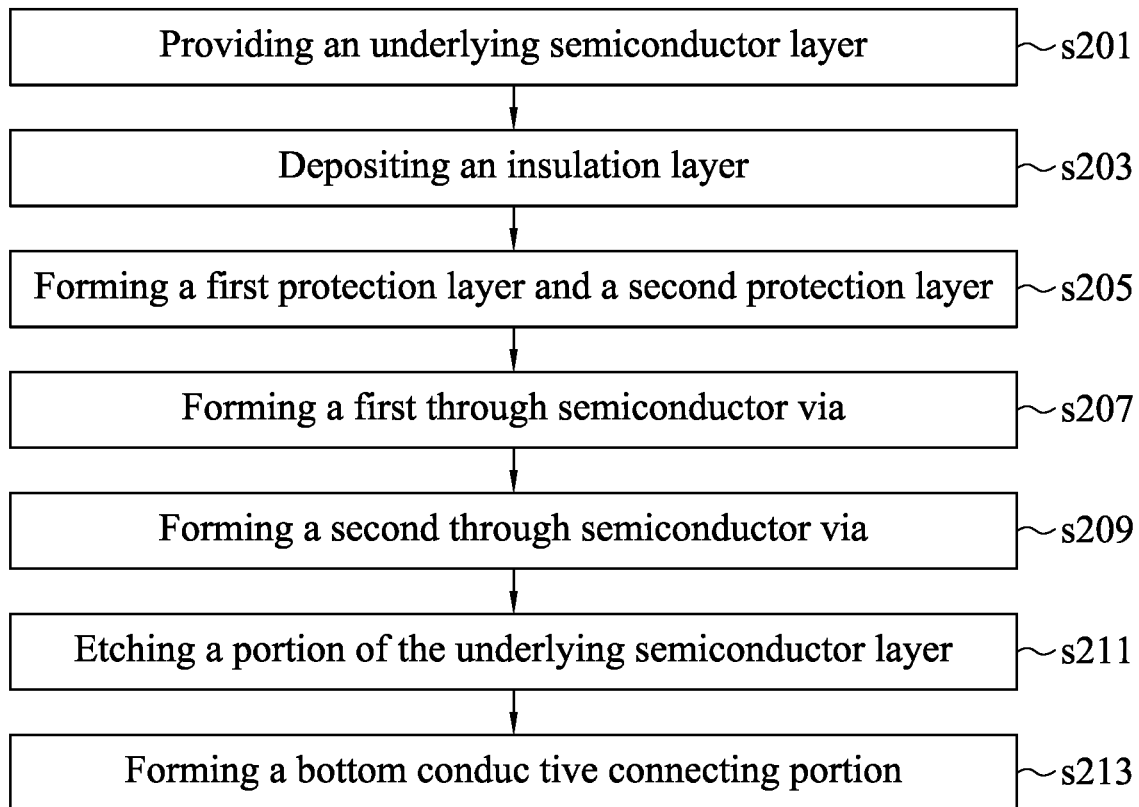
FIG. 12 is a flow diagram illustrating a method for manufacturing a semiconductor structure in accordance with some embodiments of the present disclosure.
Figure 13:
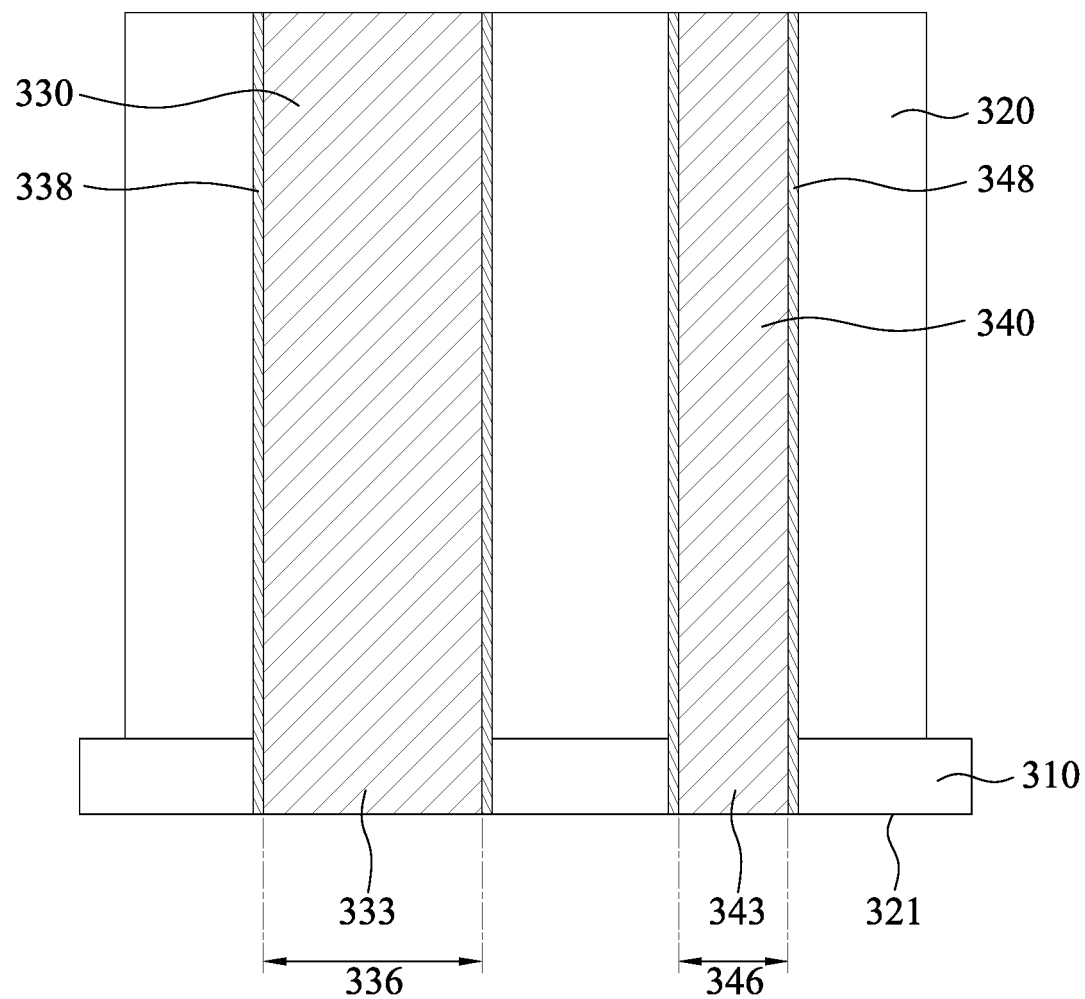
FIGS. 13 to 14 are schematic views illustrating stages of manufacturing a semiconductor structure by the method of FIG. 12 in accordance with some embodiments of the present disclosure.
Figure 14:
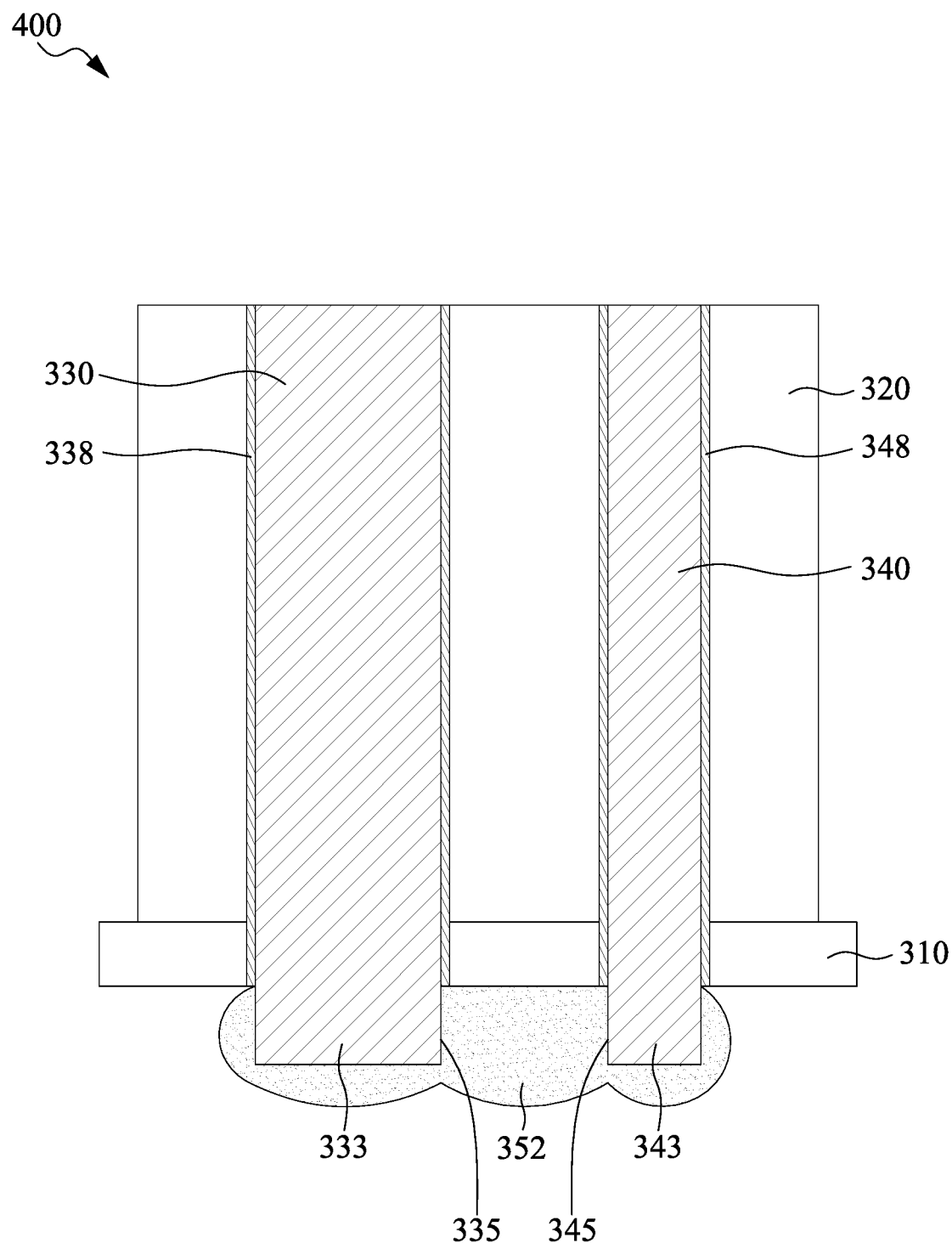

FIG. 12 is a flow diagram illustrating a method for manufacturing a semiconductor structure 400 in accordance with some embodiments of the present disclosure. FIGS. 13 to 14 are schematic views illustrating stages of manufacturing a semiconductor structure 400 by the method 200 of FIG. 12 in accordance with some embodiments of the present disclosure. In some embodiments, the method 200 of FIG. 12 for manufacturing the semiconductor structure 400 includes a number of operations (s201, s203, s205, s207, s209, s211, and s213), and the description and illustration below are not deemed as a limitation to the sequence of the operations.

In operation s201, as shown in FIG. 13, an underlying semiconductor layer 310 is provided. In some embodiments, the underlying semiconductor layer 310 includes a semiconductor substrate, such as a silicon substrate, an epitaxial substrate, a silicon carbide substrate, a silicon-on-insulator (SOI) substrate or the like. In some embodiments, a stack of semiconductor dies 360 is disposed over the underlying semiconductor layer 310.

In operation s203, as shown in FIG. 13, an insulation layer 320 is deposited over the underlying semiconductor layer 310. In some embodiments, the insulation layer 320 may be formed of oxide material or nitride material, such as silicon oxide, silicon nitride, or the like. In some embodiments, the insulation layer 320 is deposited over the stack of semiconductor dies 360.

In operation s205, as shown in FIG. 13, a first protection layer 338 and a second protection layer 348 are formed. In some embodiments, the first protection layer 338 includes tantalum material and tantalum nitride material. The second protection layer 348 includes tantalum material and tantalum nitride material. The first protection layer 338 and the second protection layer 348 are used to prevent diffusion of metal material formed in the subsequent steps.

In operation s207, as shown in FIG. 13, a first through semiconductor via 330 is formed. The first through semiconductor via 330 extends continuously through the insulation layer 320. The first through semiconductor via 330 is surrounded by the first protection layer 338. In some embodiments, the first through semiconductor via 330 is formed through the underlying semiconductor layer 310, and the first through semiconductor via 330 extends continuously through the underlying semiconductor layer 310.

In operation s209, as shown in FIG. 13, a second through semiconductor via 340 is formed. The second through semiconductor via 340 extends continuously through the insulation layer 320. In some embodiments, the second through semiconductor via 340 is formed through the underlying semiconductor layer 310, and the second through semiconductor via 340 extends continuously through the underlying semiconductor layer 310. In some embodiments, the second through semiconductor via 340 is surrounded by the second protection layer 348.

In operation s211, as shown in FIG. 14, a portion of the underlying semiconductor layer 310 is etched from a bottom surface 321 of the underlying semiconductor layer 310 to expose a first bottom end 333 of the first through semiconductor via 330 and a second bottom end 343 of the second through semiconductor via 340. In some embodiments, the portion of the underlying semiconductor layer 310 is etched using a wet etching process and a dry etching process.

In operation s213, as shown in FIG. 14, a bottom conductive connecting portion 352 is formed and laterally connected to a first bottom lateral surface 335 of the first bottom end 333 and a second bottom lateral surface 345 of the second bottom end 343 by a self-aligned deposition process. In some embodiments, the bottom conductive connecting portion 352 is formed by a plating process, such as an electroplating process.

In some embodiments, the bottom conductive connecting portion 352 includes copper material. The bottom conductive connecting portion 352 is deposited by exposing the first bottom end 333 of the first through semiconductor via 330 and the second bottom end 343 of the second through semiconductor via 340 to $GeH_4$ gas or $Ge_2H_6$ gas.

Therefore, by following the steps described above, a semiconductor structure 400 is provided, as shown in FIG. 14.

In conclusion, with the design of the semiconductor structure, the conductive connecting portion can be precisely disposed in the correct position and the conductive performance can be thereby improved.

Figure 15A:
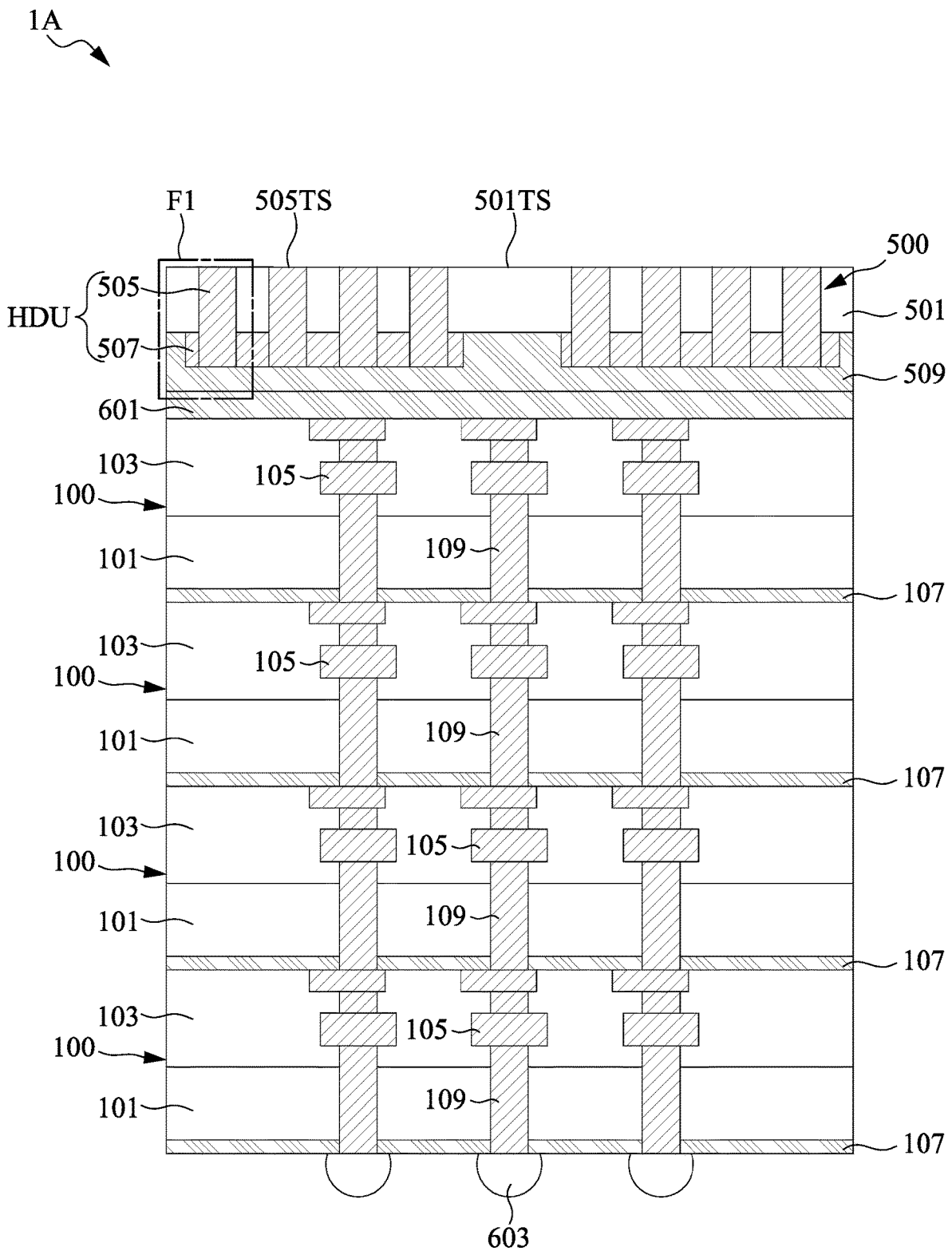
FIG. 15A is a schematic diagram of a semiconductor device in accordance with some embodiments of the present disclosure.
Figure 15B:
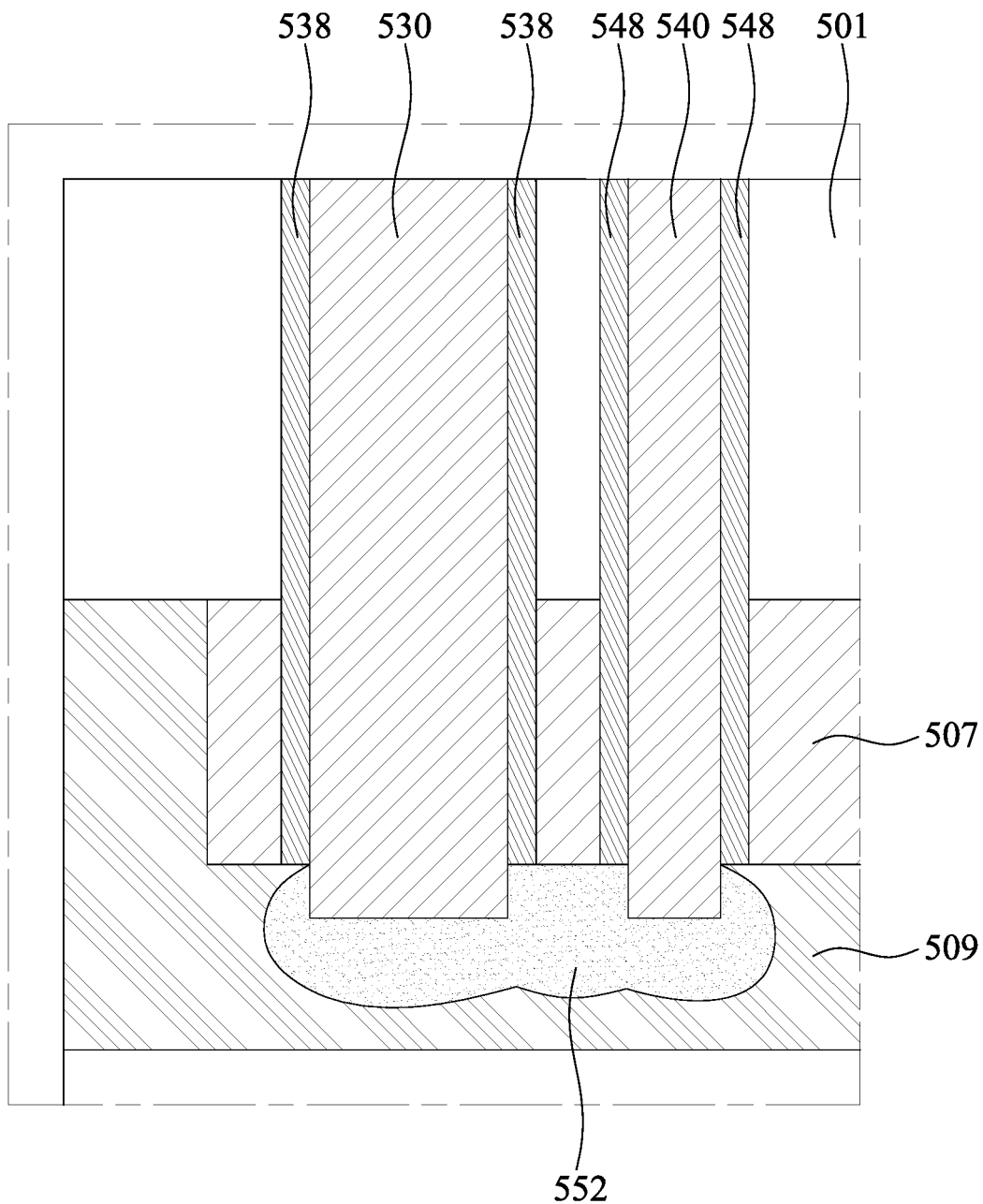
FIG. 15B is a detail structure of a portion of a heat dissipation unit of the semiconductor device shown in FIG. 15A in accordance with some embodiments of the present disclosure.

Reference is made to FIG. 15A and FIG. 15B. FIG. 15A is a schematic diagram of a semiconductor device 1A in accordance with some embodiments of the present disclosure. FIG. 15B is a detail structure of a portion of a heat dissipation unit HDU of the semiconductor device 1A in accordance with some embodiments of the present disclosure.

As illustrated in FIG. 15A, the semiconductor device 1A includes a carrier structure 500, a plurality of die structures 100, an intervening bonding layer 601, and a plurality of solder joints 603.

The carrier structure 500 includes the heat dissipation unit HDU, a carrier substrate 501, and a bonding layer 509. The heat dissipation unit HDU includes the composite vias 505 and the conductive plates 507. The heat dissipation unit HDU is formed in the carrier substrate 501 and the bonding layer 509. The intervening bonding layer 601 is configured to bond the heat dissipation unit HDU to one of the die structures 100, in which the die structures 100 are stacked disposed. The solder joints 603 are disposed on the stacked die structures 100 opposite to the heat dissipation unit HDU.

The heat dissipation unit HDU is configured to transfer the heat generated from the stacked die structures 100. In some embodiments, the semiconductor structure 400 shown in FIG. 14 can be implemented in the heat dissipation unit HDU.

FIG. 15B is a schematic diagram of a detailed structure in a frame F1, which is shown in FIG. 15A. In FIG. 15B, the composite via 505 includes a first through semiconductor via 530, a second through semiconductor via 540, and a bottom conductive connecting portion 552. A width of the first through semiconductor via 530 is greater than a width of the second through semiconductor via 540. The first through semiconductor via 530 and the second through semiconductor via 540 extend continuously through the carrier substrate 501 and the conductive plates 507. In some embodiments, the carrier substrate 501 is coplanar with top portions of the first through semiconductor via 530 and the second through semiconductor via 540. Bottom portions of the first through semiconductor via 530 and the second through semiconductor via 540 are protruding from the conductive plates 507, and the bottom conductive connecting portion 552 covers the bottom portions of the first through semiconductor via 530 and the second through semiconductor via 540.

In some embodiments, the first through semiconductor via 530, a second through semiconductor via 540, and a bottom conductive connecting portion 552 can correspond to the first through semiconductor via 330, the second through semiconductor via 340, and the bottom conductive connecting portion 352, respectively. In other words, the first through semiconductor via 530, the second through semiconductor via 540, and the bottom conductive connecting portion 552 can have the same formations and materials as the first through semiconductor via 330, the second through semiconductor via 340, and the bottom conductive connecting portion 352, respectively. Furthermore, the first through semiconductor via 530, the second through semiconductor via 540, and the bottom conductive connecting portion 552 can be generated using the same processes as the first through semiconductor via 330, the second through semiconductor via 340, and the bottom conductive connecting portion 352, respectively.

In some embodiments, the first through semiconductor via 530 and the second through semiconductor via 540 include copper material. In some embodiments, the bottom conductive connecting portion 552 is formed by a plating process, such as an electroplating process. In some embodiments, the bottom conductive connecting portion 552 includes copper material. The bottom conductive connecting portion 552 is deposited by exposing the bottom portions of the first through semiconductor via 530 and the second through semiconductor via 540 to $GeH_4$ gas or $Ge_2H_6$ gas.

The heat dissipation unit HDU further includes a first protection layer 538 and a second protection layer 548. The first protection layer 538 surrounds the first through semiconductor via 530, and the second protection layer 548 surrounds the second through semiconductor via 540. In some embodiments, the first protection layer 538 includes tantalum material and tantalum nitride material, and the second protection layer 548 includes tantalum material and tantalum nitride material. It should be noted that the first protection layer 538 and the second protection layer 548 are disposed in the carrier substrate 501 and the conductive plates 507; there is no portions of the first protection layer 538 and the second protection layer 548 protruding from the conductive plates 507.

In some embodiments, a portion of bottom surface of the first protection layer 538 and a portion of bottom surface of the second protection layer 548 are not covered by the bottom conductive connecting portion 552. Therefore, the portion of bottom surface of the first protection layer 538 and the portion of bottom surface of the second protection layer 548 are in contact with the bonding layer 509.

As illustrated in FIG. 15B, the bottom conductive connecting portion 552 is disposed within the bonding layer 509. In other word, the bottom conductive connecting portion 552 is not in contact with the intervening bonding layer 601.

In some embodiments, the carrier substrate 501 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials.

The conductive plates 507 may be formed on the carrier substrate 501 and may be separated from each other. Each one of the conductive plates 507 may connect to two or more composite vias 505. The conductive plates 507 may be formed of, for example, tungsten, cobalt, zirconium, tantalum, titanium, aluminum, ruthenium, copper, metal carbides (e.g., tantalum carbide, titanium carbide, and tantalum magnesium carbide), metal nitrides (e.g., titanium nitride), transition metal aluminides, or a combination thereof.

In some embodiments, only one conductive plate 507 may be formed on the carrier substrate 501 and may connect to all the composite vias 505.

The bonding layer 509 may be formed on the carrier substrate 501 and to cover the conductive plates 507. A planarization process, such as chemical mechanical polishing, may be performed to provide a substantially flat surface for subsequent processing steps. In some embodiments, the bonding layer 509 may be formed of, for example, a non-organic material selected from un-doped silicate glass, silicon nitride, silicon oxynitride, silicon oxide, silicon nitride oxide, and combinations thereof. In some embodiments, the bonding layer 509 may be formed of, for example, a polymer layer such as an epoxy, polyimide, benzocyclobutene, polybenzoxazole, or the like. The bonding layer 509 may be formed by a deposition process such as chemical vapor deposition, plasma-enhanced chemical vapor deposition, evaporation, or spin-on coating.

In some embodiment, each of the die structures 100 includes a substrate 101, dielectric layer 103, interconnection layers 105, a bonding layer 107, and through semiconductor vias 109.

The substrate 101 may be formed of a same material as the carrier substrate 501 but is not limited thereto. In some embodiments, the substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials.

The dielectric layer 103 may be formed on the substrate 101. In some embodiments, the dielectric layer 103 may be a stacked layer structure. The dielectric layer 103 may include a plurality of insulating sub-layers. Each of the plurality of first insulating sub-layers may have a thickness between about 0.5 µm and about 3.0 µm. The plurality of insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto. The low-k dielectric materials may have a dielectric constant less than 3.0 or even less than 2.5. In some embodiments, the low-k dielectric materials may have a dielectric constant less than 2.0. The dielectric layer 103 may be formed by deposition processes such as chemical vapor deposition, plasma-enhanced chemical vapor deposition, evaporation, or spin-on coating. Planarization processes may be respectively correspondingly performed after the deposition processes to remove excess material and provide a substantially flat surface for subsequent processing steps. Active elements and the interconnection layers 105 may be formed during the formation of the dielectric layer 103. The active elements (not shown) may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices. The active elements and the through semiconductor vias 109 may be electrically coupled.

The interconnection layers 105 may be formed in the dielectric layer 103. Each of the interconnection layers 105 may include conductive lines, conductive vias, conductive contacts, or landing pads. The interconnection layers 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The interconnection layers 105 and the active elements may be electrically coupled.

The bonding layer 107 may be formed on the substrate 101. In some embodiments, the bonding layer 107 may be formed of, for example, a non-organic material selected from un-doped silicate glass, silicon nitride, silicon oxynitride, silicon oxide, silicon nitride oxide, and combinations thereof. In some embodiments, the bonding layer 107 may be formed of, for example, a polymer layer such as an epoxy, polyimide, benzocyclobutene, polybenzoxazole, or the like. The bonding layer 107 may be formed by a deposition process such as chemical vapor deposition, plasma-enhanced chemical vapor deposition, evaporation, or spin-on coating. A planarization process, such as chemical mechanical polishing, may be performed to remove portions of the bonding layer 107 and to expose the top surface of the through semiconductor vias 109.

The intervening bonding layer 601 may be formed on the dielectric layer 103. The intervening bonding layer 601 may be formed of a same material as the bonding layer 509 but is not limited thereto. In some embodiments, the intervening bonding layer 601 may be formed of, for example, a non-organic material selected from un-doped silicate glass, silicon nitride, silicon oxynitride, silicon oxide, silicon nitride oxide, and combinations thereof. In some embodiments, the intervening bonding layer 601 may be formed of, for example, a polymer layer such as an epoxy, polyimide, benzocyclobutene, polybenzoxazole, or the like. The intervening bonding layer 601 may be formed by a deposition process such as chemical vapor deposition, plasma-enhanced chemical vapor deposition, evaporation, or spin-on coating.

Figure 16A:
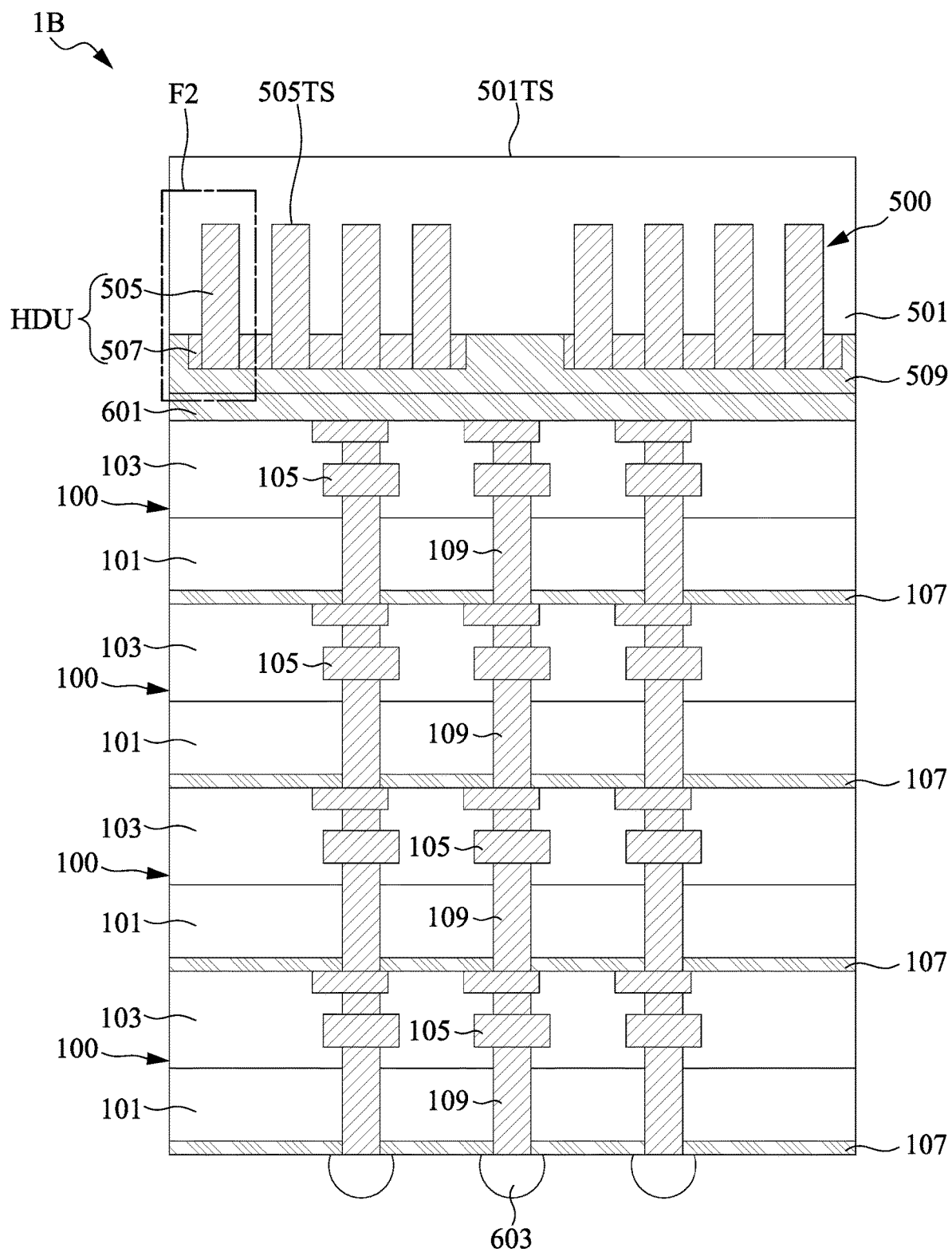
FIG. 16A is a schematic diagram of a semiconductor device in accordance with some embodiments of the present disclosure.
Figure 16B:
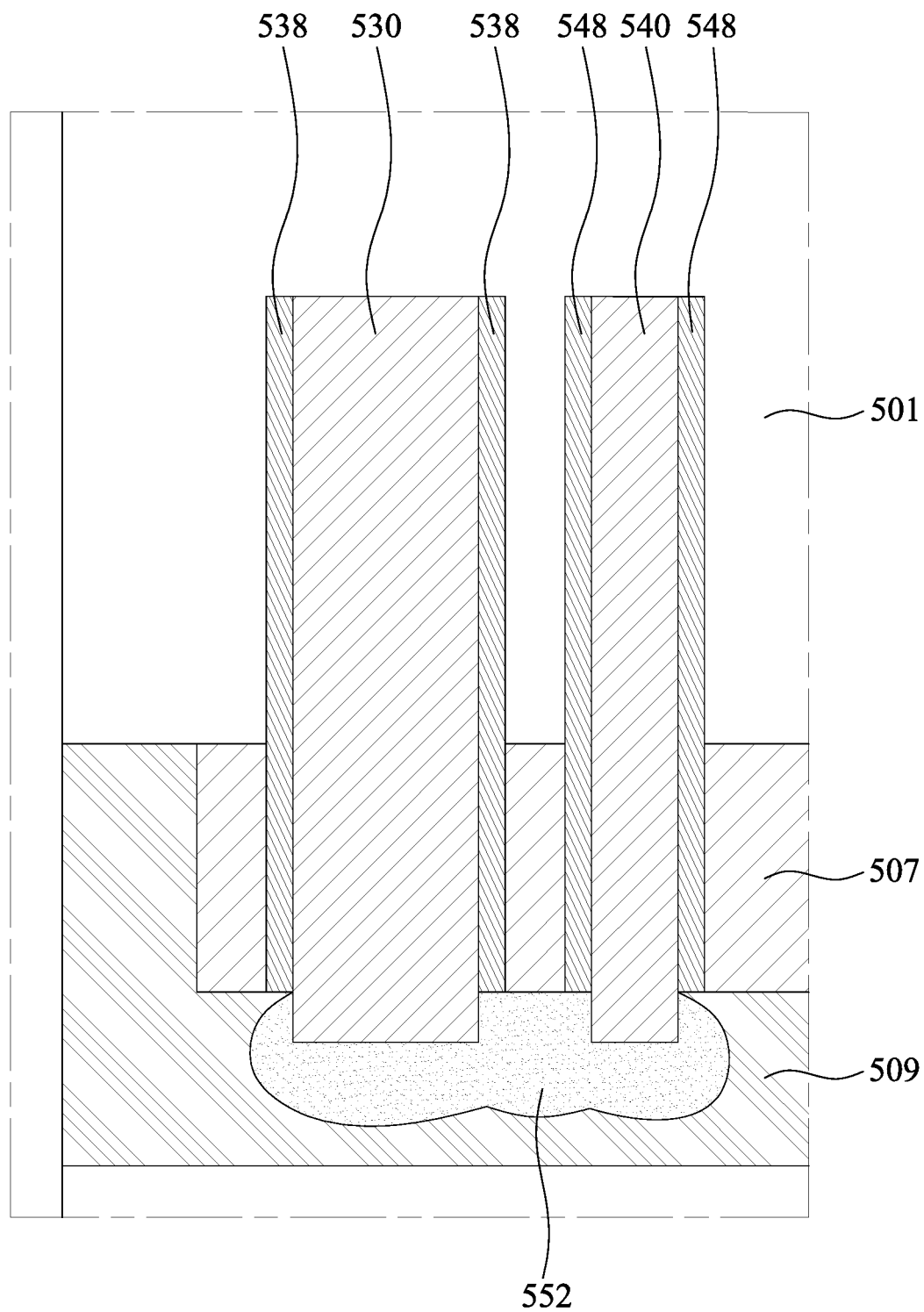
FIG. 16B is a detail structure of a portion of a heat dissipation unit of the semiconductor device shown in FIG. 16A in accordance with some embodiments of the present disclosure.

Reference is made to FIG. 16A and FIG. 16B. FIG. 16A is a schematic diagram of a semiconductor device 1B in accordance with some embodiments of the present disclosure. FIG. 16B is a detail structure of a portion of a heat dissipation unit HDU of the semiconductor device 1B in accordance with some embodiments of the present disclosure.

The semiconductor device 1B is similarly to the semiconductor device 1A except the structure of the heat dissipation unit HDU. Therefore, the details of the plurality of die structures 100, the intervening bonding layer 601, and the plurality of solder joints 603 are omitted for brevity. In some embodiments, the heat dissipation unit HDU is configured to transfer the heat generated from the stacked die structures 100. The heat dissipation unit HDU includes composite vias 505 and conductive plates 507.

FIG. 16B is a schematic diagram of a detailed structure in a frame F2, which is shown in FIG. 16A. In FIG. 16B, the composite via 505 includes a first through semiconductor via 530, a second through semiconductor via 540, and a bottom conductive connecting portion 552. A width of the first through semiconductor via 530 is greater than a width of the second through semiconductor via 540. The first through semiconductor via 530 and the second through semiconductor via 540 extend continuously through the carrier substrate 501 and the conductive plates 507. Top portions of the first through semiconductor via 530 and the second through semiconductor via 540 are within the carrier substrate 501. In other words, the top portions of the first through semiconductor via 530 and the second through semiconductor via 540 are covered by the carrier substrate 501, and there is no portion of the first through semiconductor via 530 and the second through semiconductor via 540 are exposed by the carrier substrate 501. Bottom portions of the first through semiconductor via 530 and the second through semiconductor via 540 are protruding from the conductive plates 507, and the bottom conductive connecting portion 552 covers the bottom portions of the first through semiconductor via 530 and the second through semiconductor via 540.

The heat dissipation unit HDU of the semiconductor device 1B further includes a first protection layer 538 and a second protection layer 548. The first protection layer 538 surrounds the first through semiconductor via 530, and the second protection layer 548 surrounds the second through semiconductor via 540. In some embodiments, the first protection layer 538 includes tantalum material and tantalum nitride material, and the second protection layer 548 includes tantalum material and tantalum nitride material. It should be noted that the first protection layer 538 and the second protection layer 548 are disposed in the carrier substrate 501 and the conductive plates 507; there is no portions of the first protection layer 538 and the second protection layer 548 protruding from the conductive plates 507. In addition, top portions of the first protection layer 538 and the second protection layer 548 are within the carrier substrate 501; therefore no portion of the first protection layer 538 and the second protection layer 548 protruding from the carrier substrate 501.

Figure 17A:
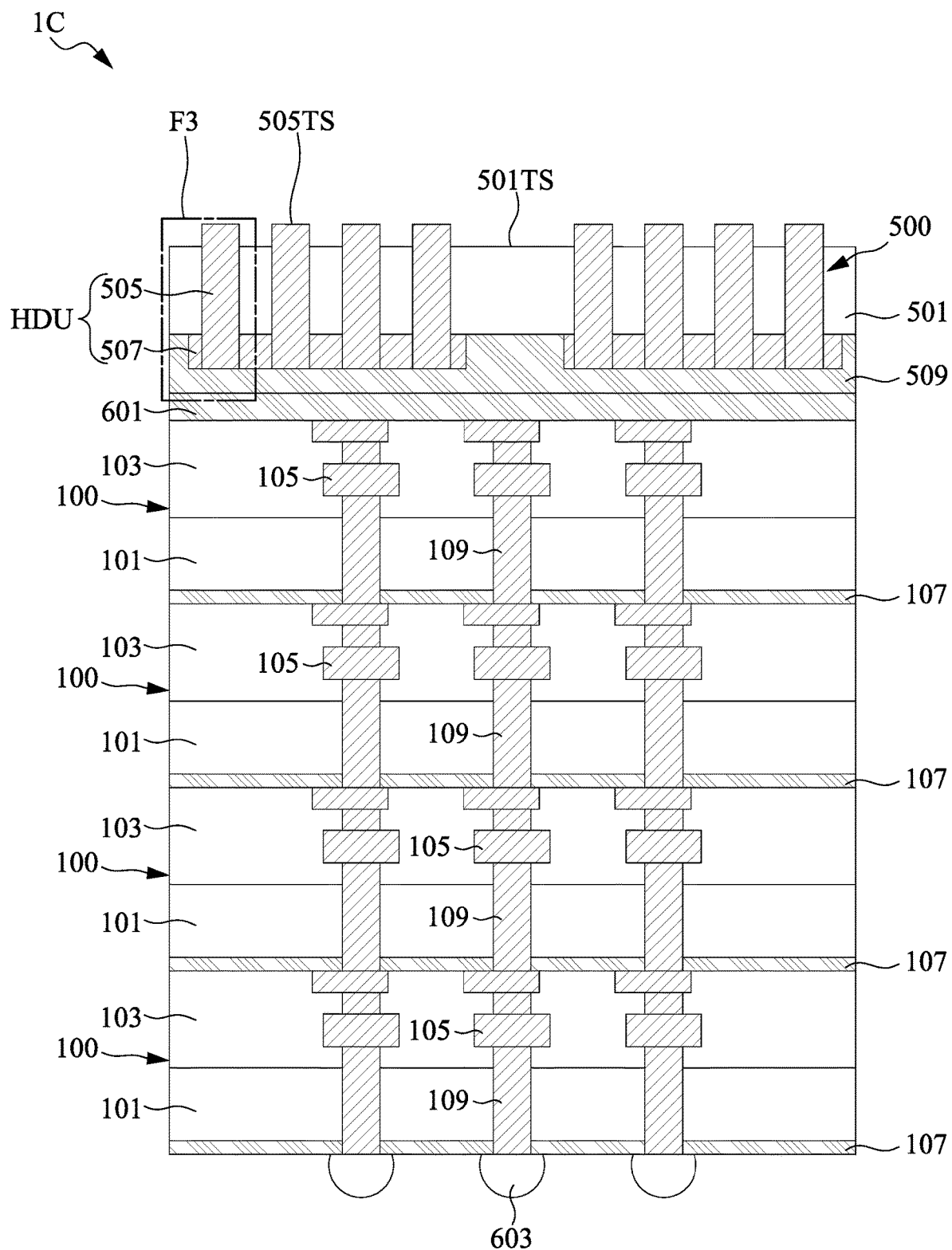
FIG. 17A is a schematic diagram of a semiconductor device in accordance with some embodiments of the present disclosure.
Figure 17B:
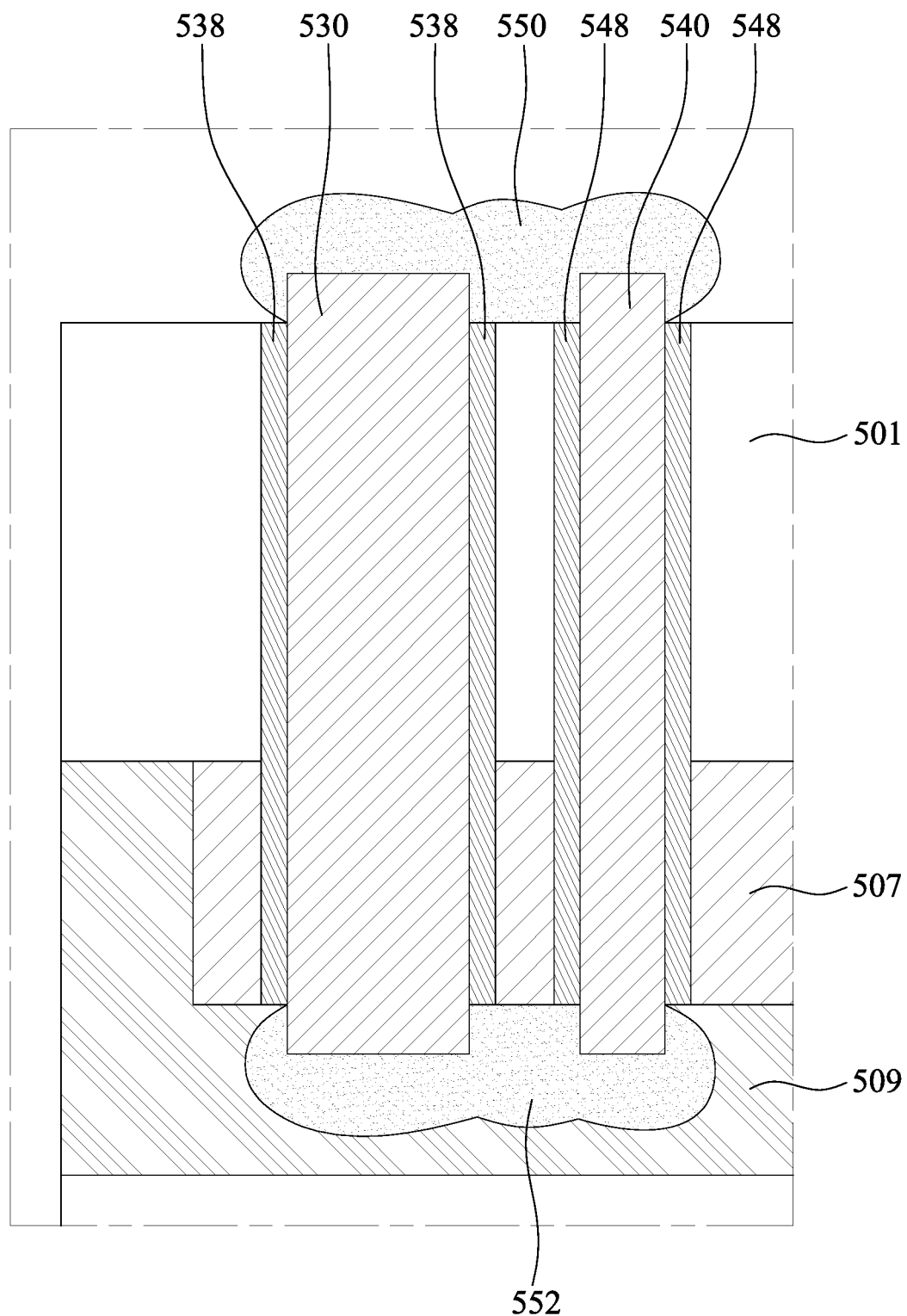
FIG. 17B is a detail structure of a portion of a heat dissipation unit of the semiconductor device show in FIG. 17A in accordance with some embodiments of the present disclosure.
Figure 17C:
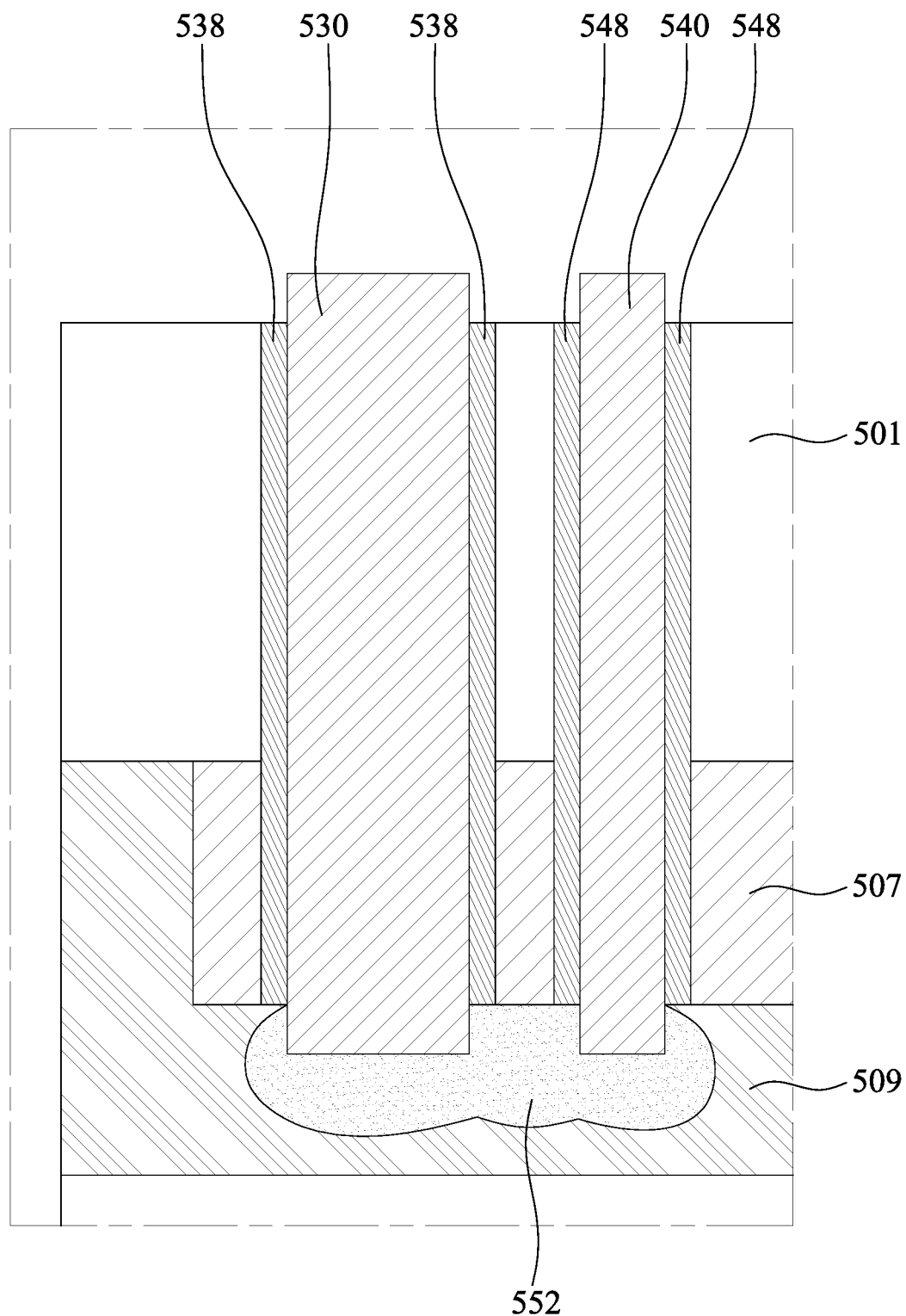
FIG. 17C is a detail structure of the portion of the heat dissipation unit of the semiconductor device show in FIG. 17A in accordance with other embodiments of the present disclosure.

Reference is made to FIG. 17A, FIG. 17B, and FIG. 17C. FIG. 17A is a schematic diagram of a semiconductor device 1C in accordance with some embodiments of the present disclosure. FIG. 17B is a detail structure of a portion of a heat dissipation unit HDU of the semiconductor device 1C in accordance with some embodiments of the present disclosure. FIG. 17C is a detail structure of the portion of the heat dissipation unit HDU of the semiconductor device 1C in accordance with other embodiments of the present disclosure.

The semiconductor device 1C is similarly to the semiconductor device 1B and the semiconductor device 1A except the structure of the heat dissipation unit HDU. Therefore, the details of the plurality of die structures 100, the intervening bonding layer 601, and the plurality of solder joints 603 are omitted for brevity. In some embodiments, the heat dissipation unit HDU is configured to transfer the heat generated from the stacked die structures 100. The heat dissipation unit HDU includes composite vias 505 and conductive plates 507.

FIG. 17B and FIG. 17C are schematic diagrams of a detailed structure in a frame F3, which is shown in FIG. 17A. In FIG. 17B, the composite via 505 includes a first through semiconductor via 530, a second through semiconductor via 540, an upper conductive connecting portion 550, and a bottom conductive connecting portion 552. A width of the first through semiconductor via 530 is greater than a width of the second through semiconductor via 540. The first through semiconductor via 530 and the second through semiconductor via 540 extend continuously through the carrier substrate 501 and the conductive plates 507. Top portions of the first through semiconductor via 530 and the second through semiconductor via 540 are protruding from the carrier substrate 501, and the upper conductive connecting portion 550 covers the top portions of the first through semiconductor via 530 and the second through semiconductor via 540. Bottom portions of the first through semiconductor via 530 and the second through semiconductor via 540 are protruding from the conductive plates 507, and the bottom conductive connecting portion 552 covers the bottom portions of the first through semiconductor via 530 and the second through semiconductor via 540. In some embodiments, the first through semiconductor via 530 is electrically coupled to the second through semiconductor via 540 through the upper conductive connecting portion 550.

The upper conductive connecting portion 550 can correspond to the upper conductive connecting portion 350 shown in FIG. 11. In some embodiments, the upper conductive connecting portion 550 can have the same formations and materials as the upper conductive connecting portion 350. In some embodiments, the upper conductive connecting portion 550 can be generated using the same processes as the upper conductive connecting portion 350. In some embodiments, the upper conductive connecting portion 550 is formed of copper-germanium alloy ($Cu_xGe_y$).

In FIG. 17C, the composite via 505 includes a first through semiconductor via 530, a second through semiconductor via 540, and a bottom conductive connecting portion 552. A width of the first through semiconductor via 530 is greater than a width of the second through semiconductor via 540. The first through semiconductor via 530 and the second through semiconductor via 540 extend continuously through the carrier substrate 501 and the conductive plates 507. Top portions of the first through semiconductor via 530 and the second through semiconductor via 540 are protruding from the carrier substrate 501. Bottom portions of the first through semiconductor via 530 and the second through semiconductor via 540 are protruding from the conductive plates 507, and the bottom conductive connecting portion 552 covers the bottom portions of the first through semiconductor via 530 and the second through semiconductor via 540. In some embodiments, the first through semiconductor via 530 is electrically coupled to the second through semiconductor via 540 through the bottom conductive connecting portion 552.

In FIG. 17B and FIG. 17C, the heat dissipation unit HDU of the semiconductor device 1C further includes a first protection layer 538 and a second protection layer 548. The first protection layer 538 surrounds the first through semiconductor via 530, and the second protection layer 548 surrounds the second through semiconductor via 540. In some embodiments, the first protection layer 538 includes tantalum material and tantalum nitride material, and the second protection layer 548 includes tantalum material and tantalum nitride material. It should be noted that the first protection layer 538 and the second protection layer 548 are disposed in the carrier substrate 501 and the conductive plates 507; there is no portions of the first protection layer 538 and the second protection layer 548 protruding from the conductive plates 507 and the carrier substrate 501.

Figure 18:
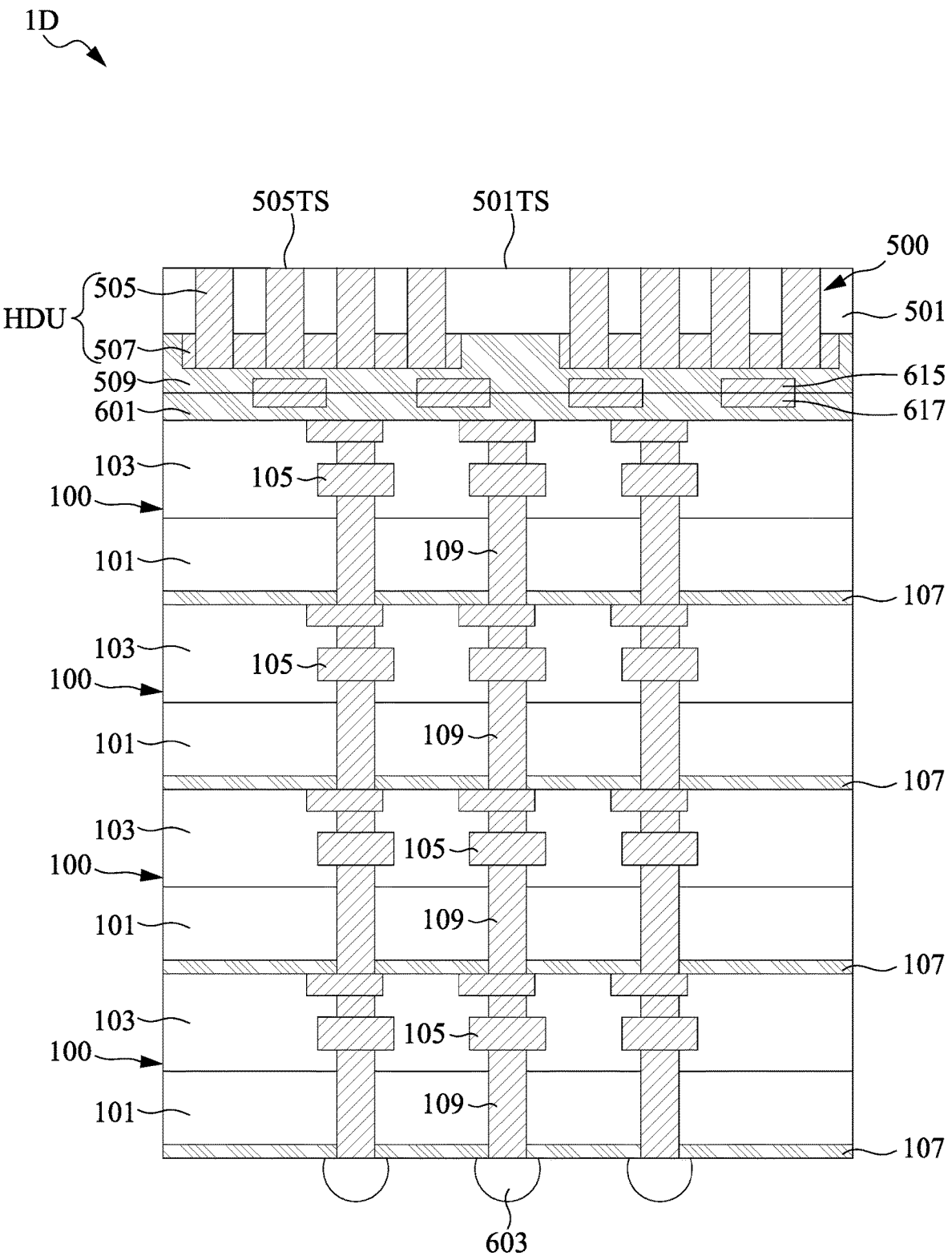
FIG. 18 is a schematic diagram of a semiconductor device in accordance with some embodiments of the present disclosure.

Reference is made to FIG. 18. FIG. 18 is a schematic diagram of a semiconductor device 1D in accordance with some embodiments of the present disclosure.

The semiconductor device 1D is similarly to the semiconductor device 1A. Therefore, the details of the carrier structure 500, the plurality of die structures 100, the intervening bonding layer 601, and the plurality of solder joints 603 are omitted for brevity.

Compared to the semiconductor device 1A, the semiconductor device 1D further includes first dummy conductive layers 615 and second dummy conductive layers 617. The first dummy conductive layers 615 may be disposed in the bonding layer 509 and may be substantially coplanar with the interface between the bonding layer 509 and the intervening bonding layer 601. The second dummy conductive layers 617 may be disposed in the intervening bonding layer 601 and may be substantially coplanar with the interface between the bonding layer 509 and the intervening bonding layer 601. The first dummy conductive layers 615 may be vertically aligned with the second dummy conductive layers 617 and may contact the second dummy conductive layers 617. The first dummy conductive layers 615 and the second dummy conductive layers 617 may be formed of, for example, tungsten, cobalt, zirconium, tantalum, titanium, aluminum, ruthenium, or copper. The first dummy conductive layers 615 and the second dummy conductive layers 617 may improve the bonding quality between the bonding layer 509 and the intervening bonding layer 601 by providing metal-to-metal bonding.

In some embodiments, the heat dissipation unit HDU of the semiconductor device 1D is the same as the heat dissipation unit HDU of the semiconductor device 1A. However, the present disclosure is not limited thereto. In various embodiments, the heat dissipation unit HDU of the semiconductor device 1D can be the same as the heat dissipation unit HDU of the semiconductor device 1B or the semiconductor device 1C.

Figure 19:
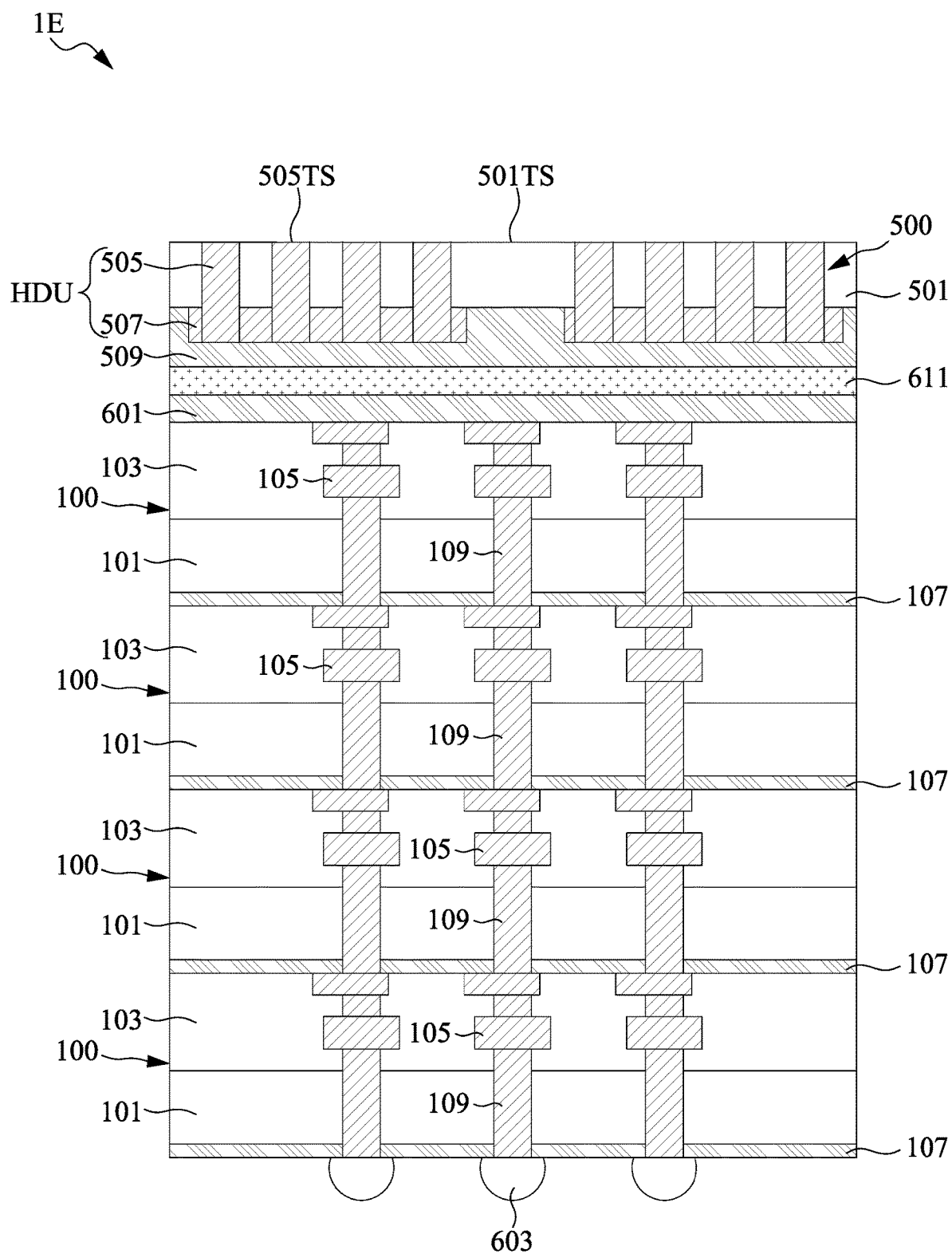
FIG. 19 is a schematic diagram of a semiconductor device in accordance with some embodiments of the present disclosure.

Reference is made to FIG. 19. FIG. 19 is a schematic diagram of a semiconductor device 1E in accordance with some embodiments of the present disclosure.

The semiconductor device 1E is similarly to the semiconductor device 1A. Therefore, the details of the carrier structure 500, the plurality of die structures 100, the intervening bonding layer 601, and the plurality of solder joints 603 are omitted for brevity.

Compared to the semiconductor device 1A, the semiconductor device 1D further includes a thermal interface layer 611 disposed between the intervening bonding layer 601 and the bonding layer 509. In some embodiments, the thermal interface layer 611 may be formed of a carbon material that is imbued with a flexible material such as a polymer matrix. For example, the thermal interface layer 611 may include generally vertically oriented graphite and carbon nanotubes, which are imbued with a fluoropolymer rubber matrix. The aspect ratio of the carbon nanotubes may be between about 1:1 and about 1:100. For another example, the thermal interface layer 611 may include graphitic carbon. For yet another example, the thermal interface layer 611 may include pyrolytic graphite sheet. In some embodiments, a thermal resistance of the thermal interface layer 611 may be less than 0.2° C. $cm_2$/Watt at a thickness between about 250 µm and about 450 µm. The thermal interface layer 611 may provide additional thermal dissipation capability to the semiconductor device 1E.

Figure 20A:
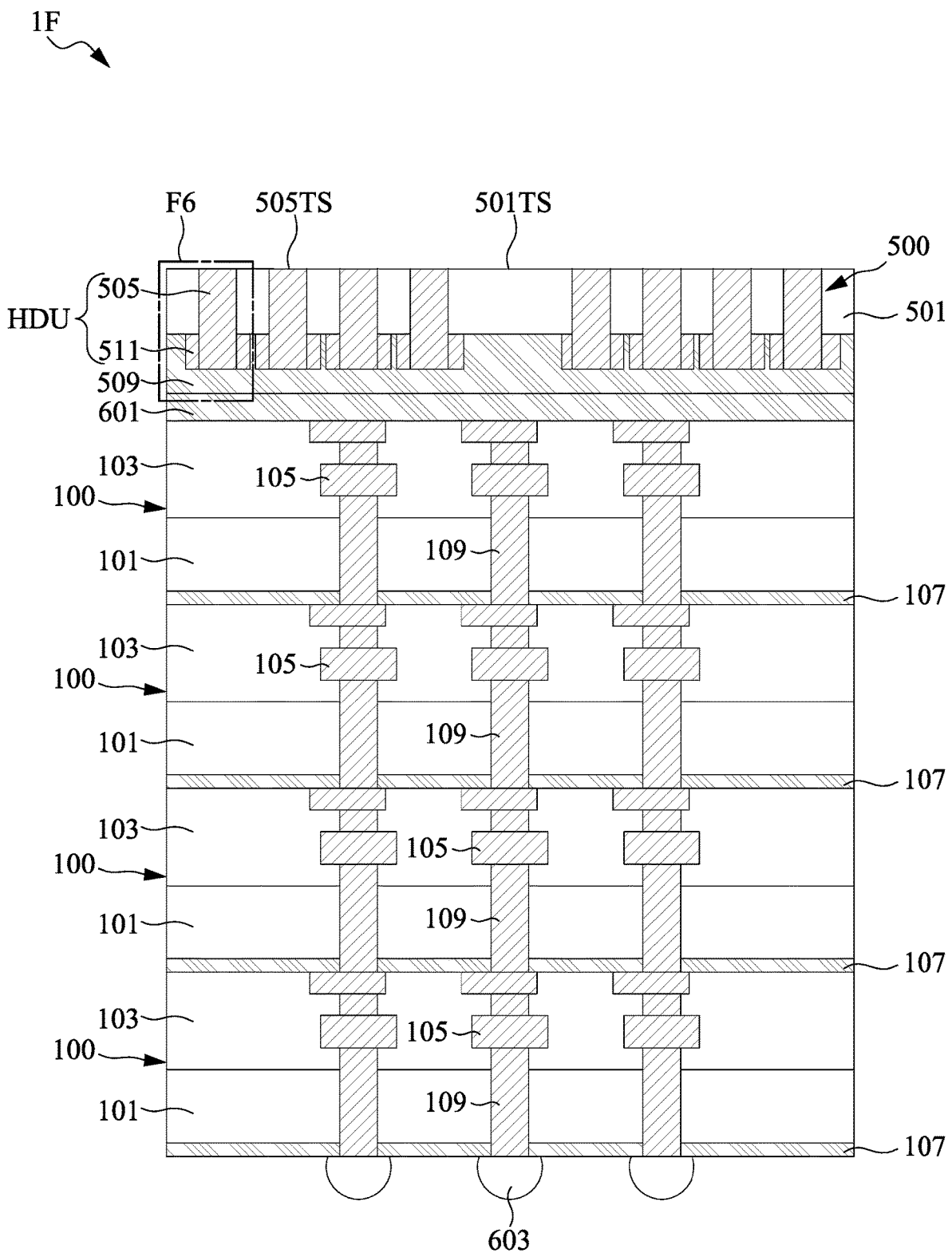
FIG. 20A is a schematic diagram of a semiconductor device in accordance with some embodiments of the present disclosure.
Figure 20B:
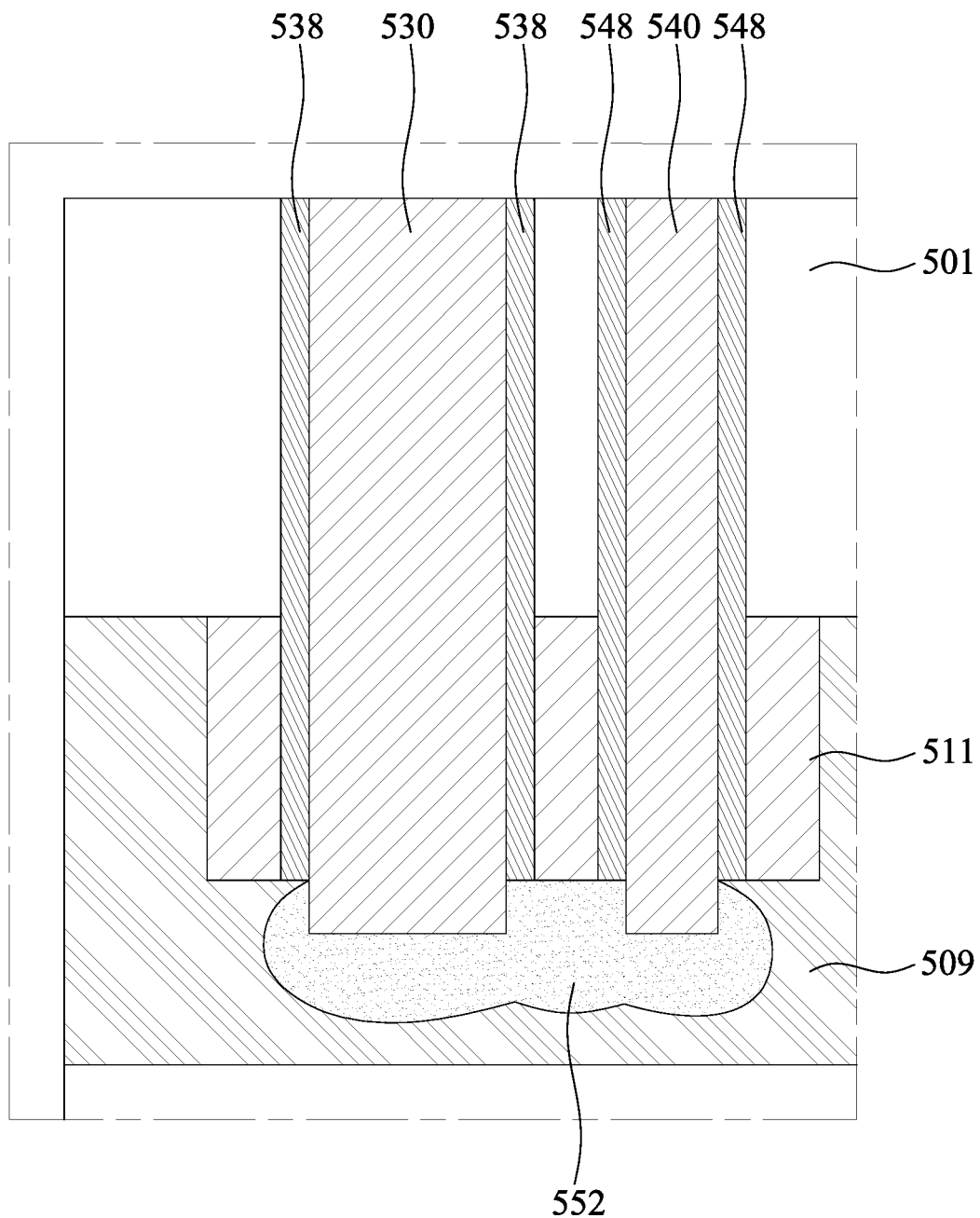
FIG. 20B is a detail structure of a portion of a heat dissipation unit of the semiconductor device shown in FIG. 20A in accordance with some embodiments of the present disclosure.

Reference is made to FIG. 20A and FIG. 20B. FIG. 20A is a schematic diagram of a semiconductor device 1F in accordance with some embodiments of the present disclosure. FIG. 20B is a detail structure of a portion of a heat dissipation unit HDU of the semiconductor device 1F in accordance with some embodiments of the present disclosure.

The semiconductor device 1F is similarly to the semiconductor device 1A except the structure of the heat dissipation unit HDU. Therefore, the details of the plurality of die structures 100, the intervening bonding layer 601, and the plurality of solder joints 603 are omitted for brevity. In some embodiments, the heat dissipation unit HDU is configured to transfer the heat generated from the stacked die structures 100. The heat dissipation unit HDU includes composite vias 505 and conductive plates 511.

FIG. 20B is a schematic diagram of a detailed structure in a frame F6, which is shown in FIG. 20A. In FIG. 20B, the composite via 505 includes a first through semiconductor via 530, a second through semiconductor via 540, and a bottom conductive connecting portion 552. A width of the first through semiconductor via 530 is greater than a width of the second through semiconductor via 540. The first through semiconductor via 530 and the second through semiconductor via 540 extend continuously through the carrier substrate 501 and the conductive plates 511. Top portions of the first through semiconductor via 530 and the second through semiconductor via 540 are coplanar with the carrier substrate 501. Bottom portions of the first through semiconductor via 530 and the second through semiconductor via 540 are protruding from the conductive plates 511, and the bottom conductive connecting portion 552 covers the bottom portions of the first through semiconductor via 530 and the second through semiconductor via 540.

Compared to the semiconductor device 1A, the heat dissipation unit HDU of the semiconductor device 1F includes more conductive plates 511. In FIG. 20A and FIG. 20B, each conductive plate 511 is coupled to one composite via 505.

The heat dissipation unit HDU of the semiconductor device 1F further includes a first protection layer 538 and a second protection layer 548. The first protection layer 538 surrounds the first through semiconductor via 530, and the second protection layer 548 surrounds the second through semiconductor via 540. In some embodiments, the first protection layer 538 includes tantalum material and tantalum nitride material, and the second protection layer 548 includes tantalum material and tantalum nitride material. It should be noted that the first protection layer 538 and the second protection layer 548 are disposed in the carrier substrate 501 and the conductive plates 507; there is no portions of the first protection layer 538 and the second protection layer 548 protruding from the conductive plates 511. In addition, top portions of the first protection layer 538 and the second protection layer 548 are within the carrier substrate 501; therefore no portion of the first protection layer 538 and the second protection layer 548 protruding from the carrier substrate 501.

Figure 21A:
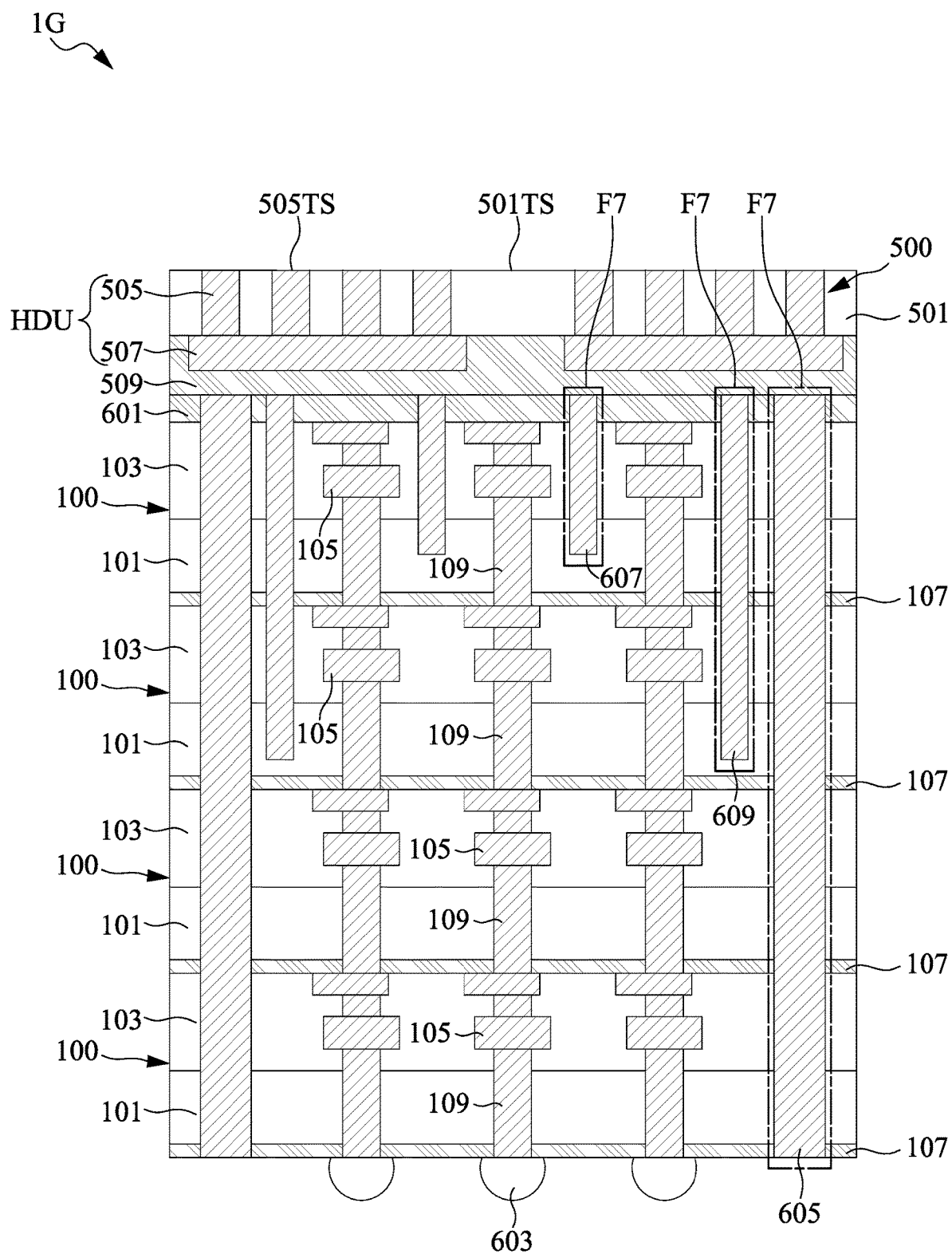
FIG. 21A is a schematic diagram of a semiconductor device in accordance with some embodiments of the present disclosure.
Figure 21B:
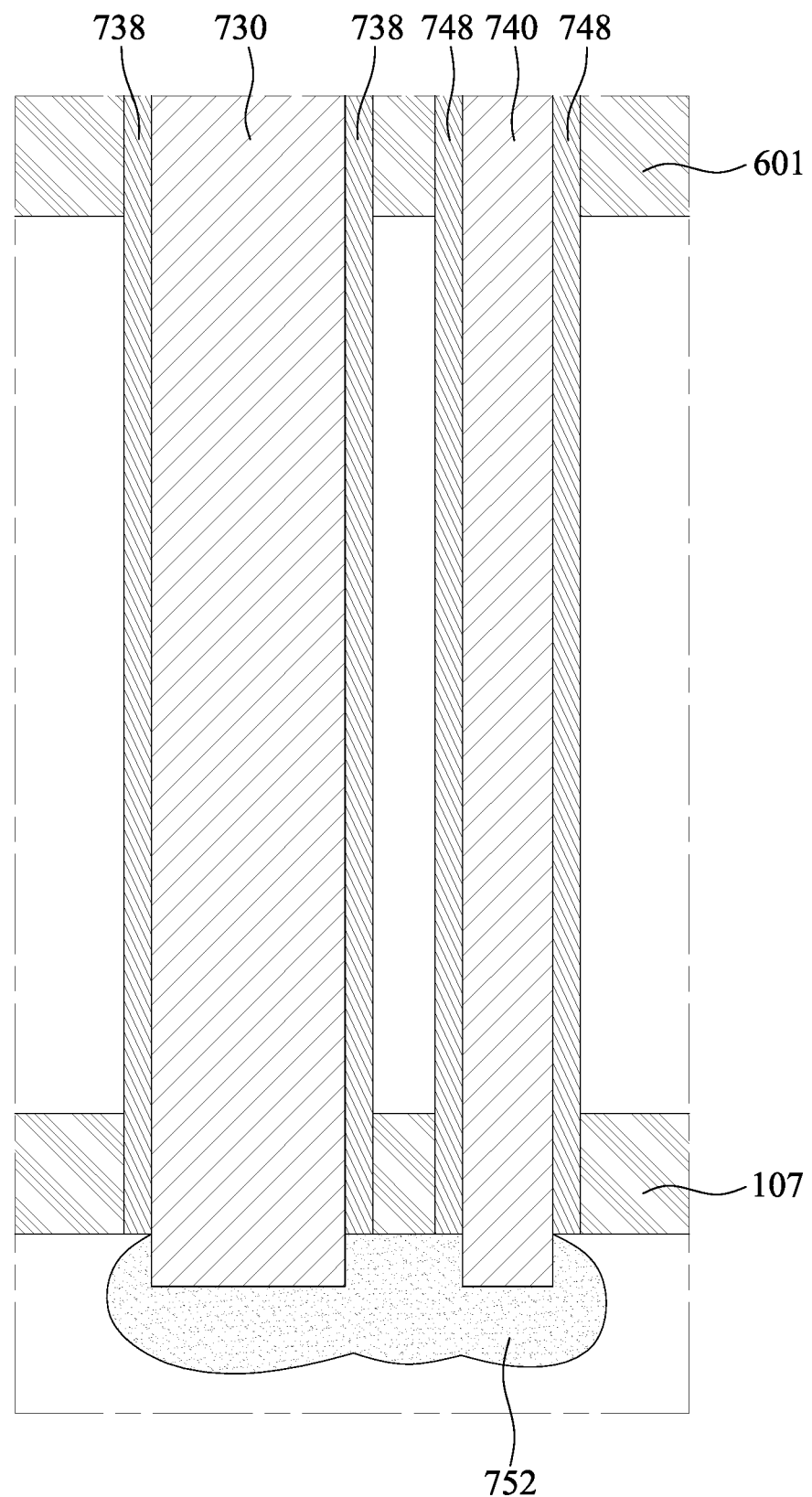
FIG. 21B is a detail structure of a portion of a heat dissipation unit of the semiconductor device shown in FIG. 21A in accordance with some embodiments of the present disclosure.

Reference is made to FIG. 21A and FIG. 21B. FIG. 21A is a schematic diagram of a semiconductor device 1G in accordance with some embodiments of the present disclosure. FIG. 21B is a detail structure of a portion of a heat dissipation unit HDU of the semiconductor device 1G in accordance with some embodiments of the present disclosure.

The semiconductor device 1G is similar to the semiconductor device 1A. Therefore, the details of the carrier structure 500, the plurality of die structures 100, the intervening bonding layer 601, and the plurality of solder joints 603 are omitted for brevity.

Compared to the semiconductor device 1A, the semiconductor device 1G further includes first dummy through semiconductor vias 605, second dummy through semiconductor vias 607, and third dummy through semiconductor vias 609.

In some embodiments, the first dummy through semiconductor vias 605, the second dummy through semiconductor vias 607 and/or the third dummy through semiconductor vias 609 are configured to transfer the heat accumulated in the stacked die structures 100 to the carrier structure 500. In some embodiments, the stacked die structure 100 may generate great heat during operation, and the stacked die structures 100 may not able to dissipate the heat without the assistance of the first dummy through semiconductor vias 605, the second dummy through semiconductor vias 607, and the third dummy through semiconductor vias 609.p The first dummy through semiconductor vias 605 may be formed along the stacked die structures 100, and the intervening bonding layer 601. The first dummy through semiconductor vias 605 may be formed after the bonding of the plurality of die structures 100. In some embodiments, conductive features may be formed in each die structure 100. After the bonding of the die structures 100, the conductive features may be vertically aligned to configure the first dummy through semiconductor vias 605. As illustrated in FIG. 21A, the first dummy through semiconductor vias 605 are exposed by the bonding layer 107. The first dummy through semiconductor vias 605 may be formed with a same material as the composite vias 505 but is not limited thereto.

The second dummy through semiconductor vias 607 may be formed along the intervening bonding layer 601 and the die structure 100 in contact with the intervening bonding layer 601. The second dummy through semiconductor vias 607 extends from the dielectric layer 103 to the substrate 101. The second dummy through semiconductor vias 607 do not penetrate the substrate 101. The second dummy through semiconductor vias 607 may be formed of a same material as the through semiconductor vias 109 but is not limited thereto. In some embodiments, the second dummy through semiconductor vias 607 substantially uniformly distributed in the die structure 100. In some embodiments, the widths of the first dummy through semiconductor vias 605 may be greater than or equal to the widths of the second dummy through semiconductor vias 607.

The third dummy through semiconductor vias 609 may be disposed along two die structures 100, and extending to the substrate 101 of the second die structure 100. In some embodiments, the widths of the first dummy through semiconductor vias 605 may be greater than or equal to the widths of the third dummy through semiconductor vias 609.

In some embodiments, the semiconductor device 1G do not include the second dummy through semiconductor vias 607 and the third dummy through semiconductor vias 609. In other embodiments, the semiconductor device 1G do not include the third dummy through semiconductor vias 609.

FIG. 21B is a schematic diagram of a detailed structure in a frame F7, which is shown in FIG. 21A. In FIG. 21B, the first dummy through semiconductor via 605 includes a first through semiconductor via 730, a second through semiconductor via 740, and a bottom conductive connecting portion 752. A width of the first through semiconductor via 730 is greater than a width of the second through semiconductor via 740. The first through semiconductor via 730 and the second through semiconductor via 740 extend continuously through the stacked die structures 100. Top portions of the first through semiconductor via 730 and the second through semiconductor via 740 are coplanar with the intervening bonding layer 601. Bottom portions of the first through semiconductor via 730 and the second through semiconductor via 740 are protruding from the bonding layer 107, and the bottom conductive connecting portion 752 covers the bottom portions of the first through semiconductor via 730 and the second through semiconductor via 740. In some embodiments, the first through semiconductor via 730 is electrically coupled to the second through semiconductor via 740 through the bottom conductive connecting portion 752.

The first dummy through semiconductor via 605 further includes a first protection layer 738 and a second protection layer 748. The first protection layer 738 surrounds the first through semiconductor via 730, and the second protection layer 748 surrounds the second through semiconductor via 740. In some embodiments, the first protection layer 738 includes tantalum material and tantalum nitride material, and the second protection layer 748 includes tantalum material and tantalum nitride material. It should be noted that no portions of the first protection layer 738 and the second protection layer 748 protruding from the bonding layer 107.

In some embodiments, the second dummy through semiconductor vias 607 and the third dummy through semiconductor vias 609 are similar to the first dummy through semiconductor vias 605. Therefore, the details of the second dummy through semiconductor vias 607 and the third dummy through semiconductor vias 609 are omitted for brevity.

Figure 22A:
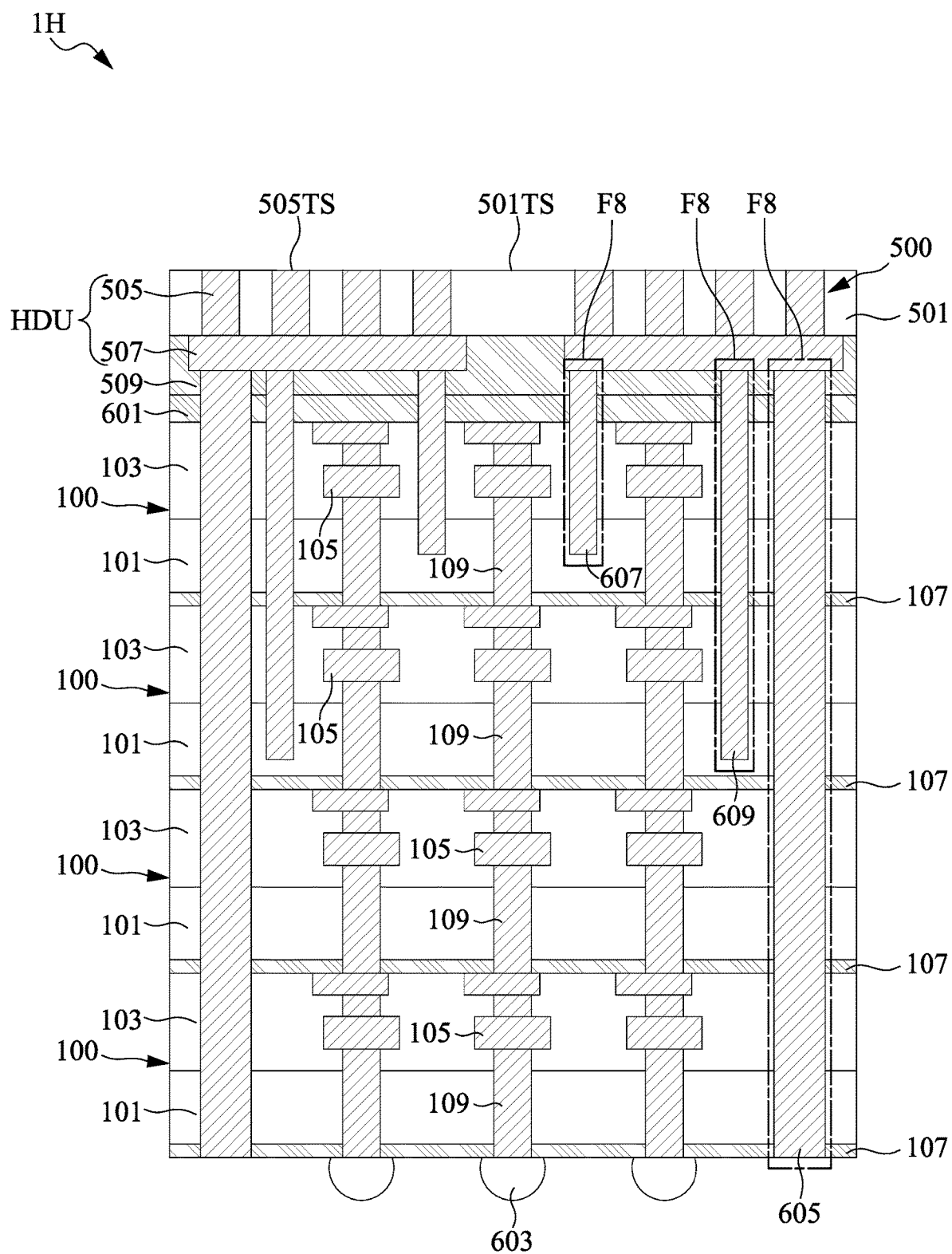
FIG. 22A is a schematic diagram of a semiconductor device in accordance with some embodiments of the present disclosure.
Figure 22B:
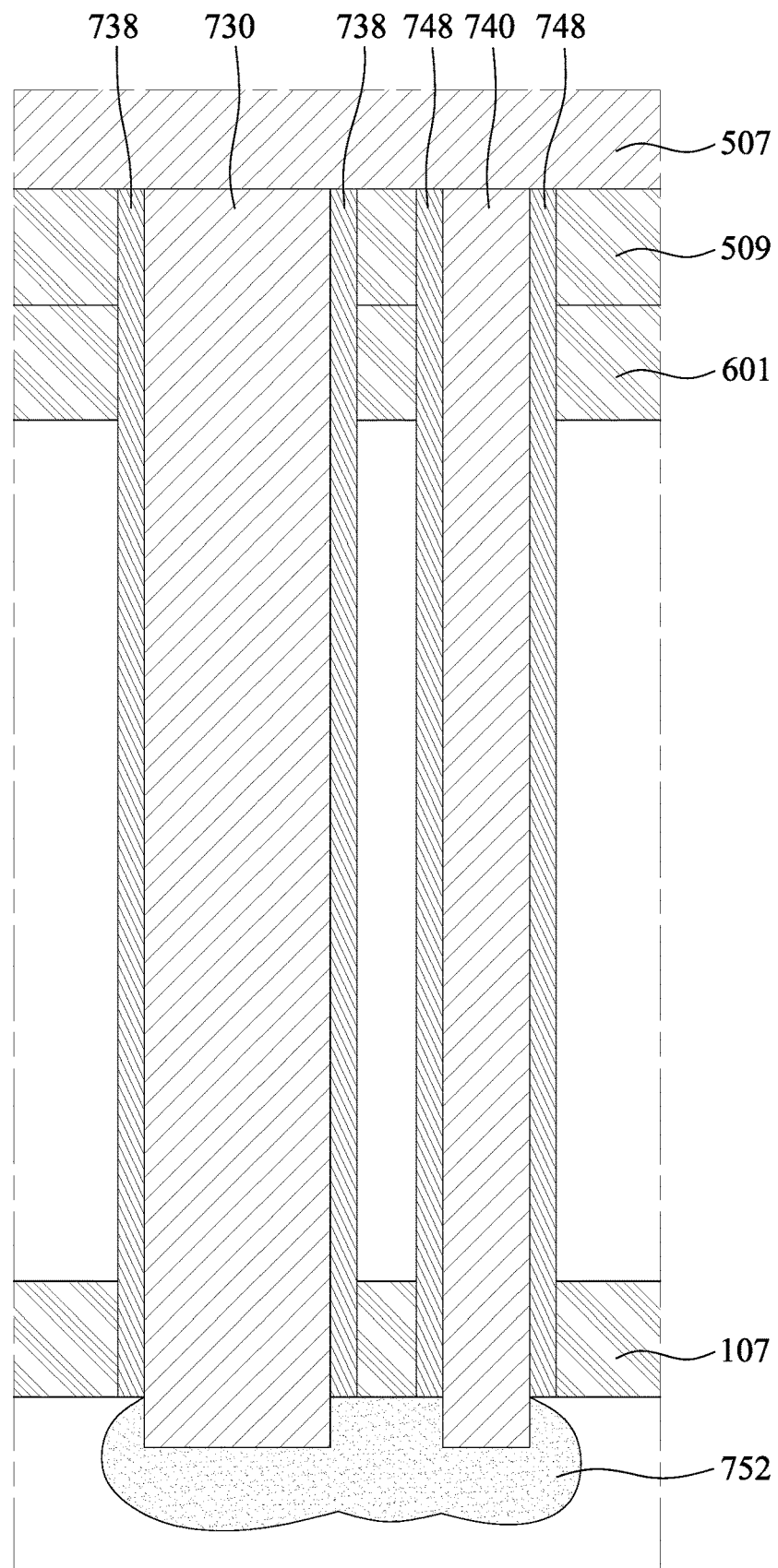
FIG. 22B is a detail structure of a portion of a heat dissipation unit of the semiconductor device shown in FIG. 22A in accordance with some embodiments of the present disclosure.

Reference is made to FIG. 22A and FIG. 22B. FIG. 22A is a schematic diagram of a semiconductor device 1H in accordance with some embodiments of the present disclosure. FIG. 22B is a detail structure of a portion of a heat dissipation unit HDU of the semiconductor device 1H in accordance with some embodiments of the present disclosure.

The semiconductor device 1H is similar to the semiconductor device 1G. Therefore, the details of the carrier structure 500, the plurality of die structures 100, the intervening bonding layer 601, and the plurality of solder joints 603 are omitted for brevity.

Compared to the semiconductor device 1G, the first dummy through semiconductor vias 605, the second dummy through semiconductor vias 607, and the third dummy through semiconductor vias 609 of the semiconductor device 1H are further extended to the bonding layer 509, and in contact with the conductive plates 507.

In some embodiments, the first dummy through semiconductor vias 605, the second dummy through semiconductor vias 607 and/or the third dummy through semiconductor vias 609 are configured to transfer the heat accumulated in the stacked die structures 100 to the carrier structure 500. In some embodiments, the stacked die structure 100 may generate great heat during operation, and the stacked die structures 100 may not able to dissipate the heat without the assistance of the first dummy through semiconductor vias 605, the second dummy through semiconductor vias 607, and the third dummy through semiconductor vias 609.

FIG. 22B is a schematic diagram of a detailed structure in a frame F8, which is shown in FIG. 22A. In FIG. 22B, the first dummy through semiconductor via 605 includes a first through semiconductor via 730, a second through semiconductor via 740, and a bottom conductive connecting portion 752. A width of the first through semiconductor via 730 is greater than a width of the second through semiconductor via 740. The first through semiconductor via 730 and the second through semiconductor via 740 extend continuously through the stacked die structures 100. Top portions of the first through semiconductor via 730 and the second through semiconductor via 740 are in contact with the conductive plate 507. Bottom portions of the first through semiconductor via 730 and the second through semiconductor via 740 are protruding from the bonding layer 107, and the bottom conductive connecting portion 752 covers the bottom portions of the first through semiconductor via 730 and the second through semiconductor via 740.

The first dummy through semiconductor via 605 further includes a first protection layer 738 and a second protection layer 748. The first protection layer 738 surrounds the first through semiconductor via 730, and the second protection layer 748 surrounds the second through semiconductor via 740. In some embodiments, the first protection layer 738 includes tantalum material and tantalum nitride material, and the second protection layer 748 includes tantalum material and tantalum nitride material. It should be noted that no portions of the first protection layer 738 and the second protection layer 748 protruding from the bonding layer 107.

In some embodiments, the second dummy through semiconductor vias 607 and the third dummy through semiconductor vias 609 are similar to the first dummy through semiconductor vias 605. Therefore, the details of the second dummy through semiconductor vias 607 and the third dummy through semiconductor vias 609 are omitted for brevity.

One aspect of the present disclosure provides a semiconductor device. The semiconductor device includes a die stack, an intervening bonding layer, and a carrier structure. The intervening bonding layer is positioned on the die stack. The carrier structure is disposed on the intervening bonding layer opposite to the die stack. The carrier structure includes a heat dissipation unit configured to transfer heat generated from the die stack. The heat dissipation unit includes composite vias and conductive plates. Each of the composite vias includes a first through semiconductor via and a second through semiconductor via. The conductive plates are couple to the composite vias.

Another aspect of the present disclosure provides a semiconductor device. The semiconductor device includes a first die structure, a second die structure, an intervening bonding layer, a carrier structure, and a first dummy through semiconductor via. The first die structure is stacked over the second die structure. The intervening bonding layer is positioned on the first die structure opposite to the second die structure. The carrier structure is disposed on the intervening bonding layer opposite to the first die structure. The first dummy through semiconductor via is configured to transfer heat accumulated in the first die structure and the second die structure. The first dummy through semiconductor via includes a first via, a second via, and a first bottom conductive connecting portion. The first bottom conductive connecting portion is electrically coupled to the first via and the second via.

Another aspect of the present disclosure provides a method for manufacturing a semiconductor device. The method includes: providing a carrier structure; providing a first die structure having a through semiconductor via; forming an intervening bonding layer on the first die structure; bonding the first die structure onto the carrier structure through the intervening bonding layer; and bonding a second die structure onto the first die structure, wherein the second die structure and the first die structure are electrically coupled by the through semiconductor via. The operation of providing the carrier structure includes: providing a carrier substrate; forming a bonding layer on the carrier substrate; and forming a heat dissipation unit in the carrier substrate and the bonding layer, wherein the carrier substrate, the bonding layer, and the heat dissipation unit together configure the carrier structure. The operation of forming the heat dissipation unit in the carrier substrate and the bonding layer includes forming a conductive plate; and forming a composite via on the conductive plate, wherein the composite via comprises a first through via, a second through via, and a bottom conductive connecting portion. A bottom portion of the first through via and a bottom portion of the second through via are covered by the bottom conductive connecting portion.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first die structure;
   a second die structure, wherein the first die structure is stacked over the second die structure;
   an intervening bonding layer positioned on the first die structure opposite to the second die structure;
   a carrier structure disposed on the intervening bonding layer opposite to the first die structure; and
   a first dummy through semiconductor via, configured to transfer heat accumulated in the first die structure and the second die structure, comprising:
   a first via;
   a second via extended spaced apart from the first via; and
   a first bottom conductive connecting portion, electrically coupled to bottom portions of the first via and the second via, wherein top portions of the first via and the second via are protruded from the first bottom conductive connecting portion.

2. The semiconductor device of claim 1, further comprising a first protection layer surrounding the first via and a second protection layer surrounding the second via, wherein a width of the first via is greater than a width of the second via, wherein the bottom portions of the first via and the second via are exposed from the first protection layer and the second protection layer respectively.

3. The semiconductor device of claim 1, wherein a length of the first via is equal to a length of the second via, wherein the first via and the second via are parallel with each other.

4. The semiconductor device of claim 1, wherein the carrier structure comprises:
   a bonding layer, disposed over the intervening bonding layer;
   a carrier substrate, disposed over the bonding layer; and
   a heat dissipation unit, disposed in the bonding layer and the carrier substrate.

5. The semiconductor device of claim 4, wherein the heat dissipation unit comprises:
   a plurality of first composite vias;
   a plurality of second composite vias;
   a first conductive plate, coupled to the plurality of first composite vias; and
   a second conductive plate, coupled to the plurality of second composite vias.

6. The semiconductor device of claim 1, wherein the first via and the second via are extending through the first die structure and the second die structure.

7. The semiconductor device of claim 6, wherein the top portions of the first via and the second via are in contact with the intervening bonding layer.

8. The semiconductor device of claim 6, wherein the top portions of the first via and the second via are in contact with the carrier structure.

9. The semiconductor device of claim 1, further comprising:
   a second dummy through semiconductor via, configured to transfer heat accumulated in the first die structure and the second die structure, comprising:
   a third via;
   a fourth via extended spaced apart from the third via; and
   a second bottom conductive connecting portion, electrically coupled to bottom portions of the third via and the fourth via, wherein top portions of the third via and the fourth via are protruded from the second bottom conductive connecting portion.

10. The semiconductor device of claim 9, wherein a length of the first dummy through semiconductor via is greater than a length of the second dummy through semiconductor via.

11. The semiconductor device of claim 9, wherein the second dummy through semiconductor via is disposed in the first die structure and the second die structure, and is not exposed by the second die structure.

12. The semiconductor device of claim 9, further comprising:
   a third dummy through semiconductor via, configured to transfer heat accumulated in the first die structure and the second die structure, comprising:
   a fifth via;
   a sixth via extended spaced apart from the fifth via; and
   a third bottom conductive connecting portion, electrically coupled to bottom portions of the fifth via and the sixth via, wherein top portions of the fifth via and the sixth via are protruded from the third bottom conductive connecting portion.

13. The semiconductor device of claim 12, wherein a length of the second dummy through semiconductor via is greater than a length of the third dummy through semiconductor via.

14. The semiconductor device of claim 12, wherein the third dummy through semiconductor via is disposed in the first die structure, and is not in contact with the second die structure.

* * * * *